United States Patent
Yang et al.

(10) Patent No.: US 11,152,486 B2
(45) Date of Patent: Oct. 19, 2021

(54) FINFET SEMICONDUCTOR DEVICE HAVING SOURCE/DRAIN CONTACT(S) SEPARATED BY AIRGAP SPACER(S) FROM THE GATE STACK(S) TO REDUCE PARASITIC CAPACITANCE

(71) Applicant: Taiwan Semiconductor Manufacturing Co., Ltd., Hsinchu (TW)

(72) Inventors: Cheng-Yu Yang, Changhua County (TW); Kai-Hsuan Lee, Hsinchu (TW); Wei-Yang Lee, Taipei (TW); Fu-Kai Yang, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 234 days.

(21) Appl. No.: 16/511,258

(22) Filed: Jul. 15, 2019

(65) Prior Publication Data
US 2021/0020757 A1   Jan. 21, 2021

(51) Int. Cl.
| H01L 29/66 | (2006.01) |
| H01L 27/088 | (2006.01) |
| H01L 29/40 | (2006.01) |
| H01L 29/417 | (2006.01) |

(52) U.S. Cl.
CPC ...... *H01L 29/6653* (2013.01); *H01L 27/0886* (2013.01); *H01L 29/401* (2013.01); *H01L 29/41775* (2013.01); *H01L 29/41791* (2013.01); *H01L 29/6656* (2013.01); *H01L 29/66553* (2013.01); *H01L 29/66795* (2013.01)

(58) Field of Classification Search
CPC ............. H01L 29/6653; H01L 27/0886; H01L 29/66795; H01L 29/66553; H01L 29/401; H01L 29/41775; H01L 29/41791; H01L 29/6656; H01L 29/785; H01L 29/0653; H01L 27/0924; H01L 21/823821; H01L 21/823864; H01L 21/823878
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |

(Continued)

*Primary Examiner* — Ermias T Woldegeorgis
(74) *Attorney, Agent, or Firm* — Haynes and Boone, LLP

(57) ABSTRACT

Semiconductor devices and methods of forming the same are provided. A semiconductor device according to one embodiment includes a first gate stack, a second gate stack, a first source/drain feature disposed between the first and second gate stacks, and a source/drain contact over and electrically coupled to the first source/drain feature. The source/drain contact is spaced apart from each of the first and second gate stacks by an inner spacer disposed on sidewalls of the source/drain contact, a first air gap, a first gate spacer, and a second air gap separated from the first air gap by the first gate spacer.

20 Claims, 27 Drawing Sheets

(56) References Cited

U.S. PATENT DOCUMENTS

| | | | |
|---|---|---|---|
| 9,520,482 B1 | 12/2016 | Chang et al. | |
| 9,576,814 B2 | 2/2017 | Wu et al. | |
| 9,608,065 B1* | 3/2017 | Bergendahl | H01L 27/0886 |
| 9,876,114 B2 | 1/2018 | JangJian et al. | |
| 9,892,961 B1* | 2/2018 | Cheng | H01L 21/0217 |
| 10,026,824 B1* | 7/2018 | Chanemougame | H01L 29/785 |
| 10,128,334 B1* | 11/2018 | Bourjot | H01L 29/72 |
| 10,229,983 B1* | 3/2019 | Bu | H01L 29/42376 |
| 2015/0021683 A1* | 1/2015 | Xie | H01L 21/823425 |
| | | | 257/330 |
| 2015/0263122 A1* | 9/2015 | Hsiao | H01L 29/6656 |
| | | | 257/401 |
| 2018/0033863 A1* | 2/2018 | Xie | H01L 29/0653 |
| 2018/0130899 A1* | 5/2018 | Zhang | H01L 29/7851 |
| 2019/0221650 A1* | 7/2019 | Zang | H01L 29/66575 |
| 2019/0296123 A1* | 9/2019 | Lee | H01L 21/02167 |
| 2019/0378909 A1* | 12/2019 | Cheng | H01L 21/7682 |

* cited by examiner

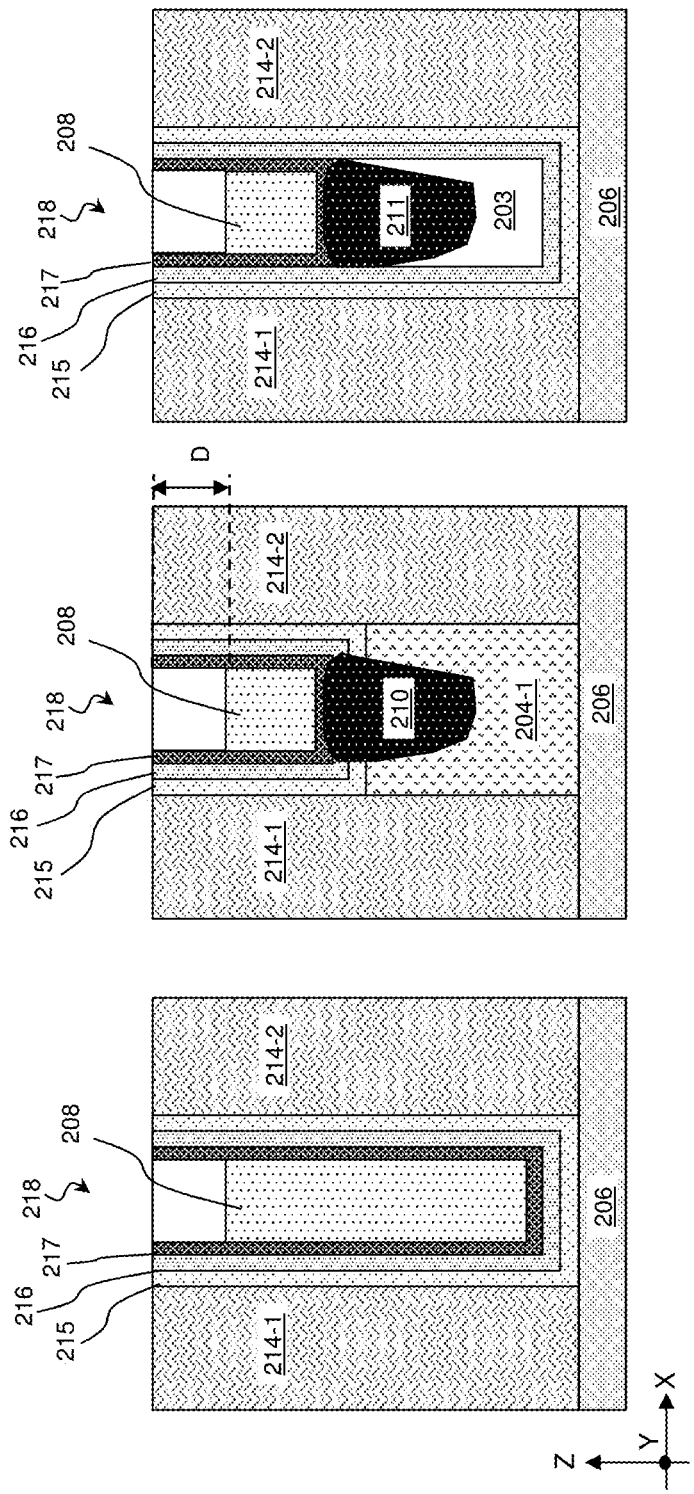

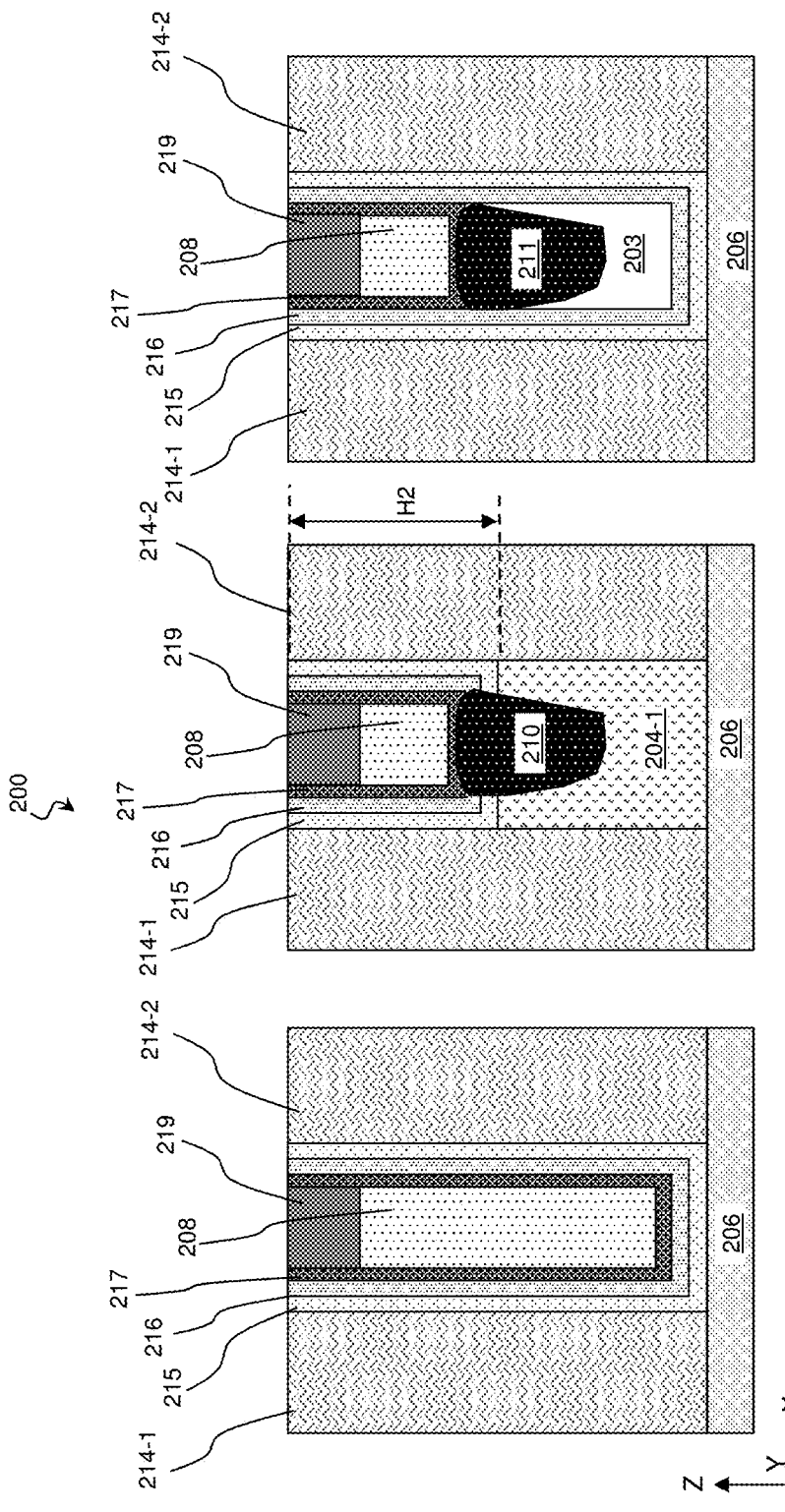

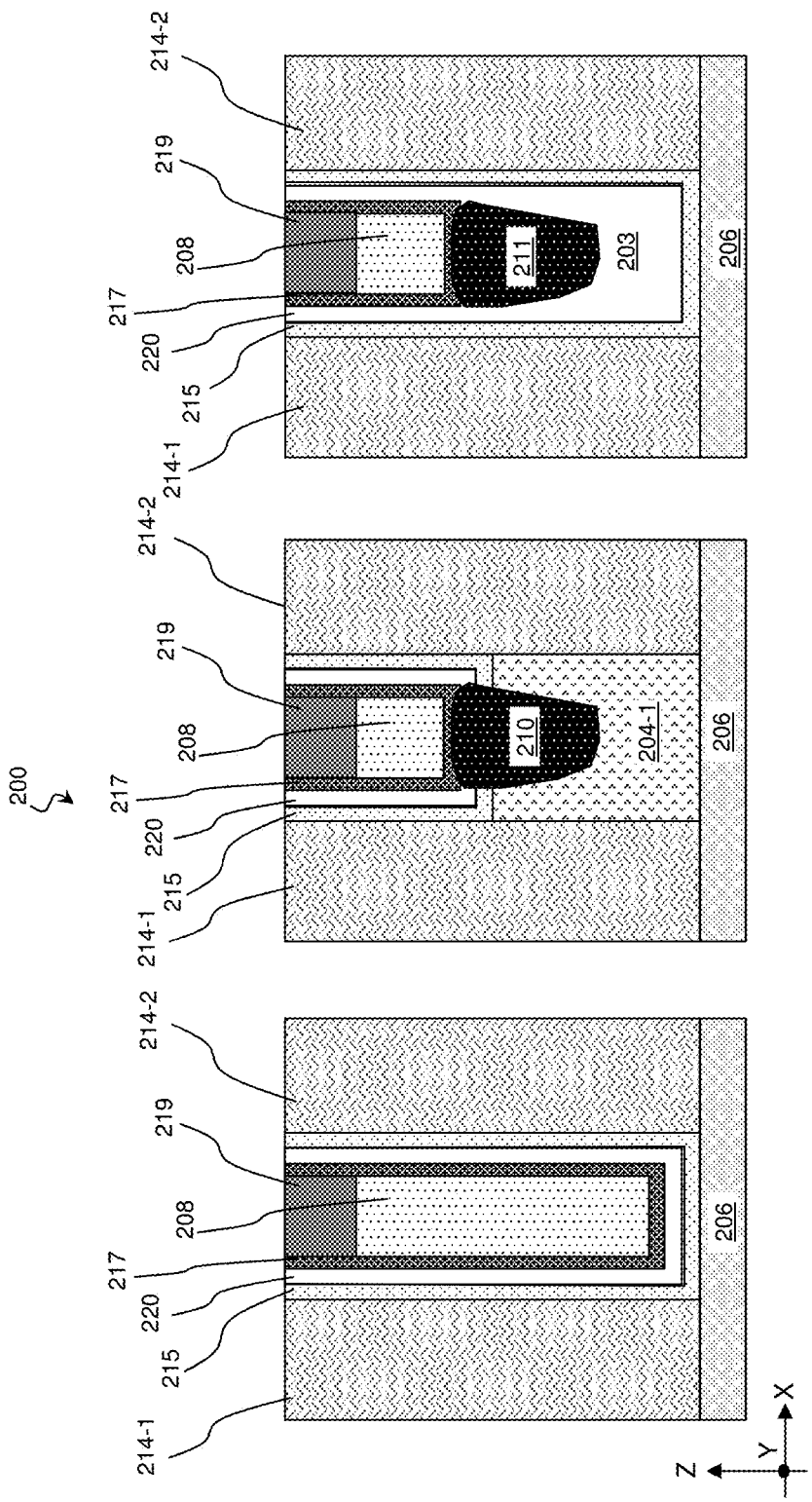

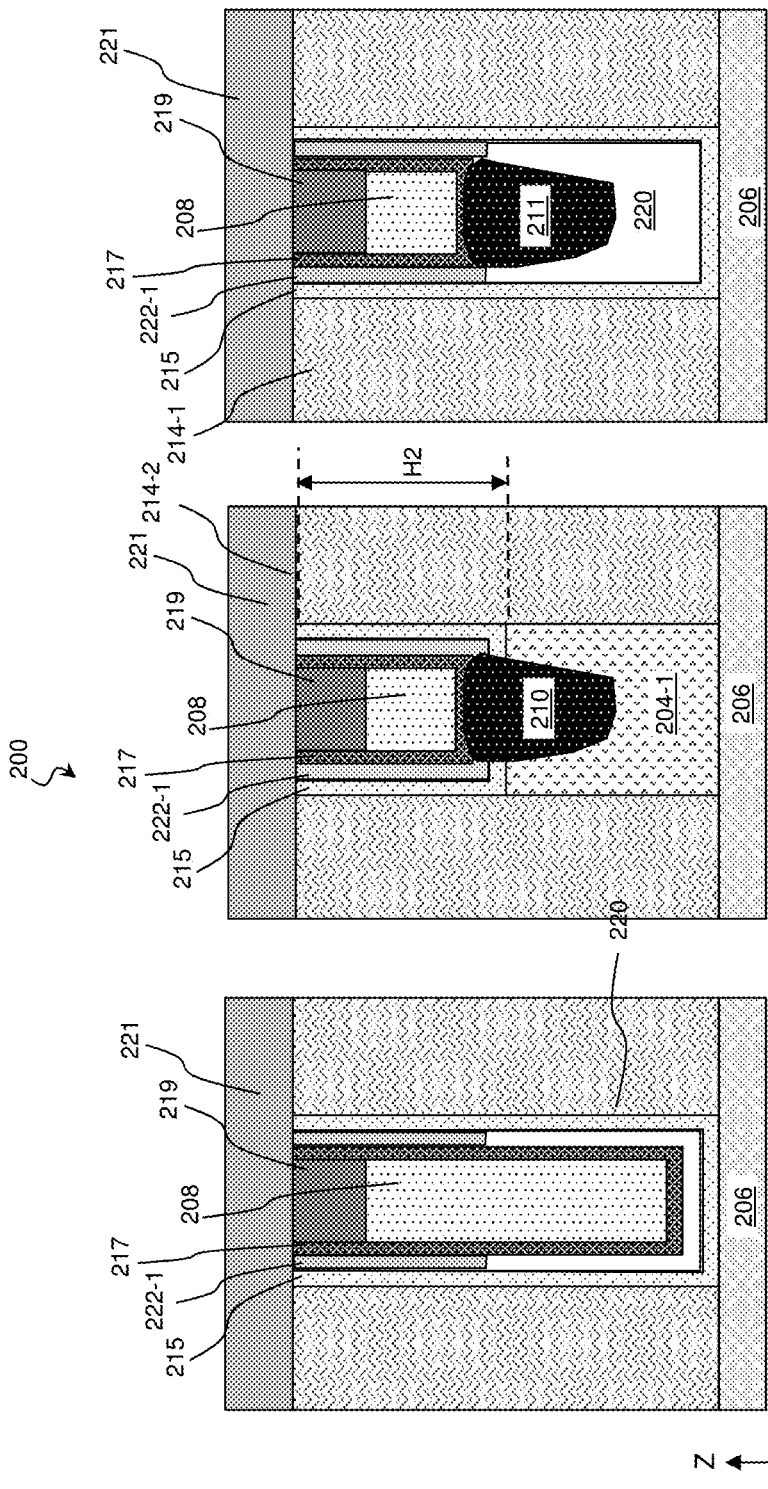

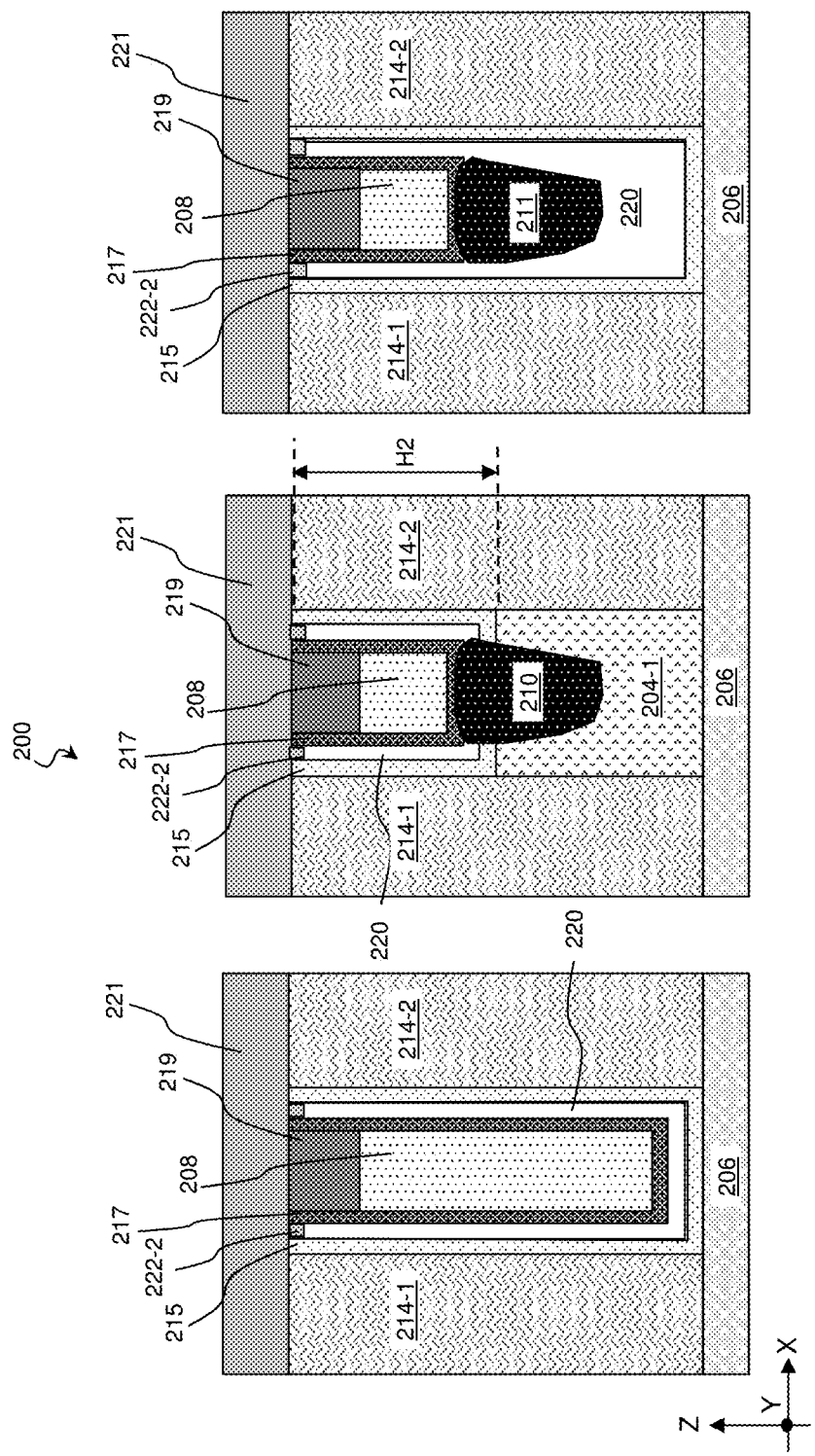

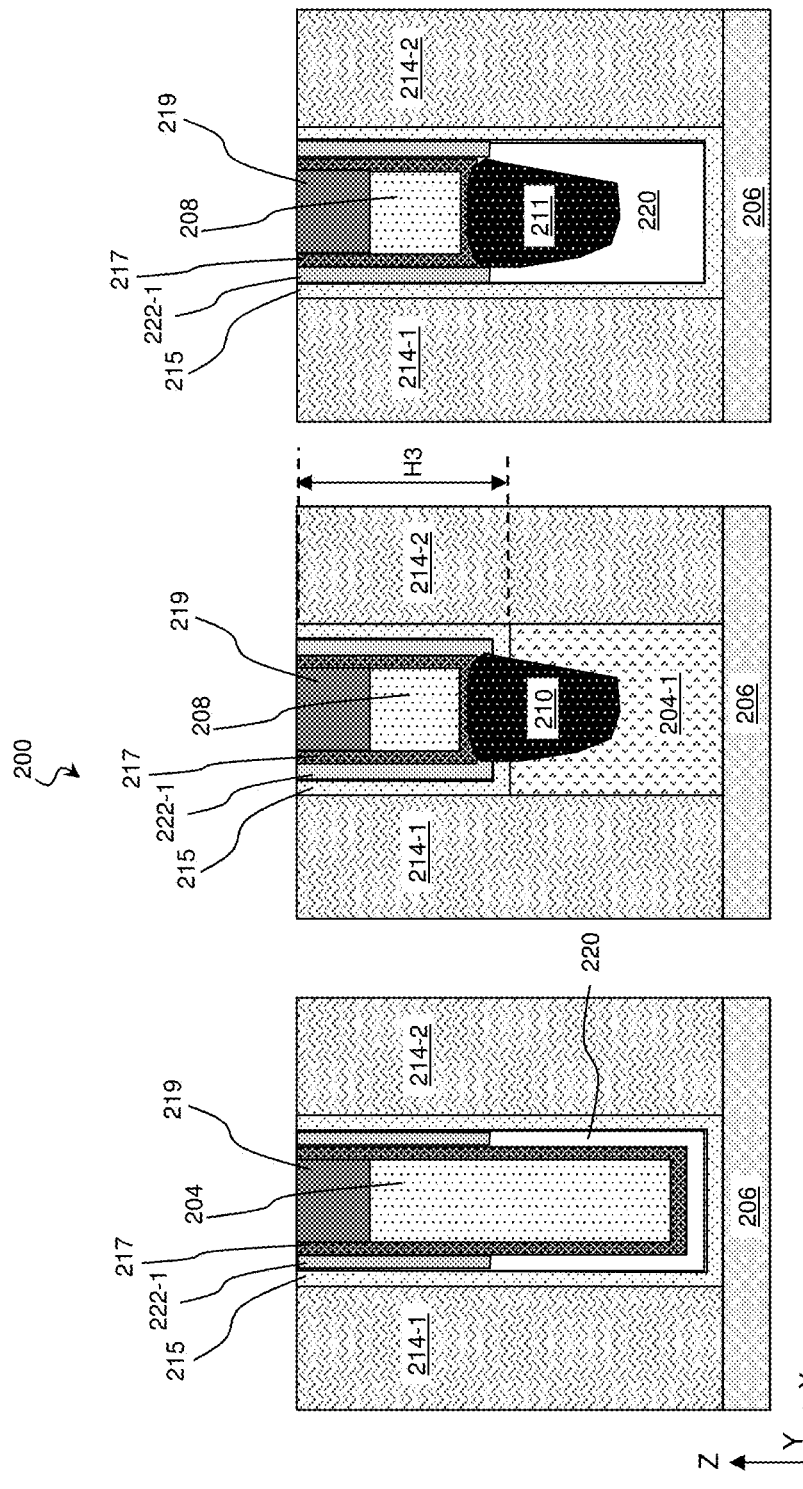

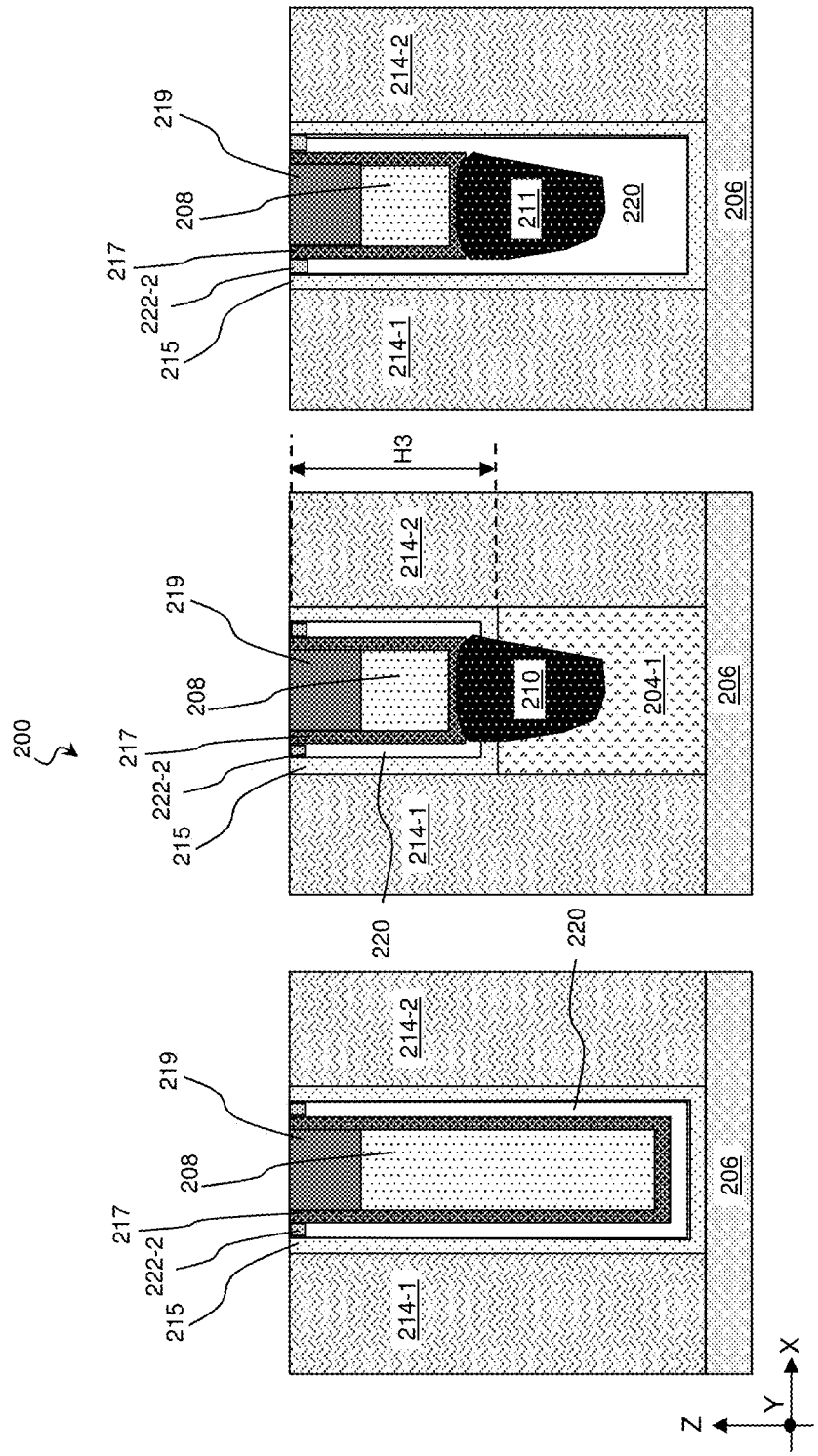

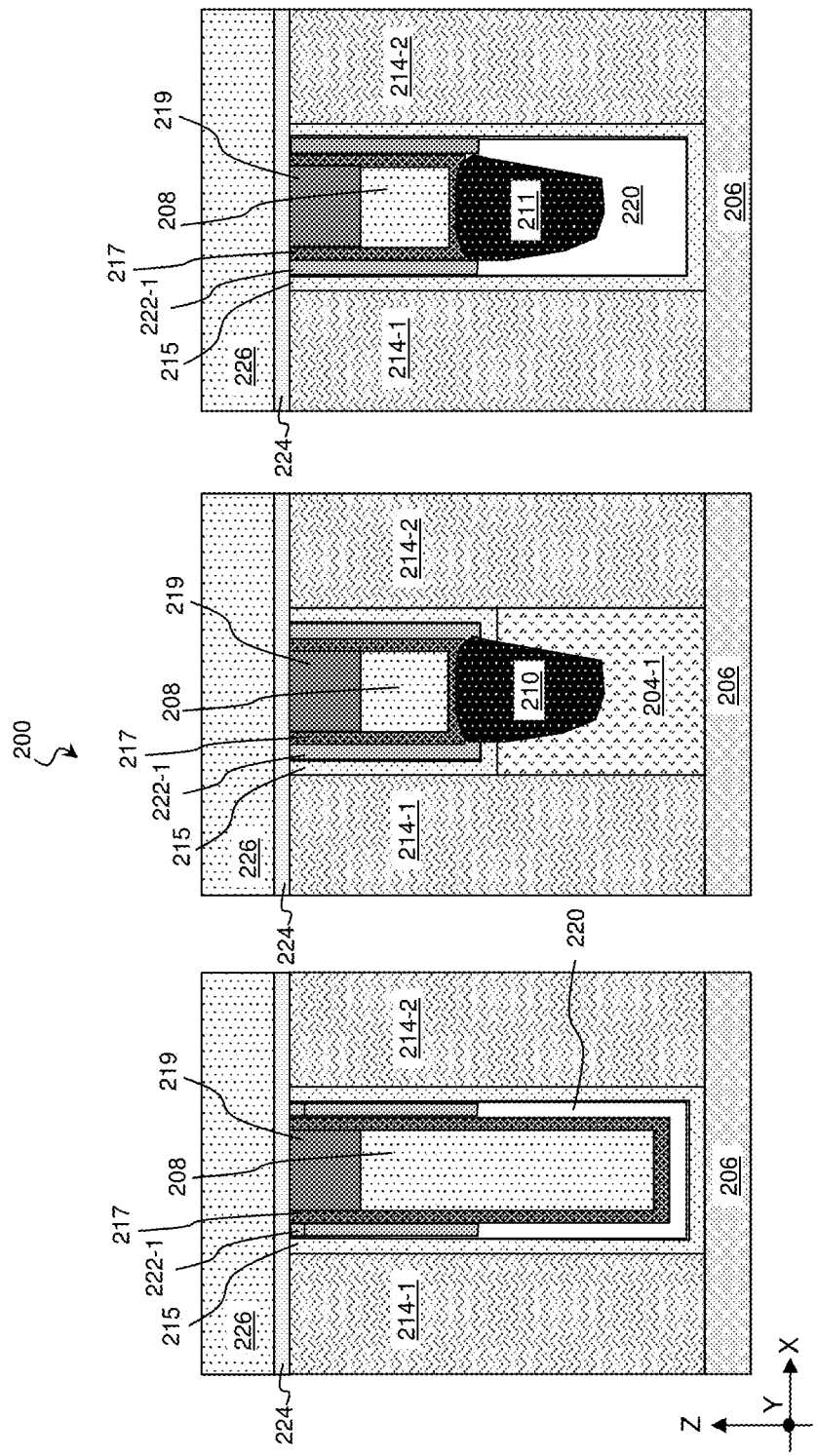

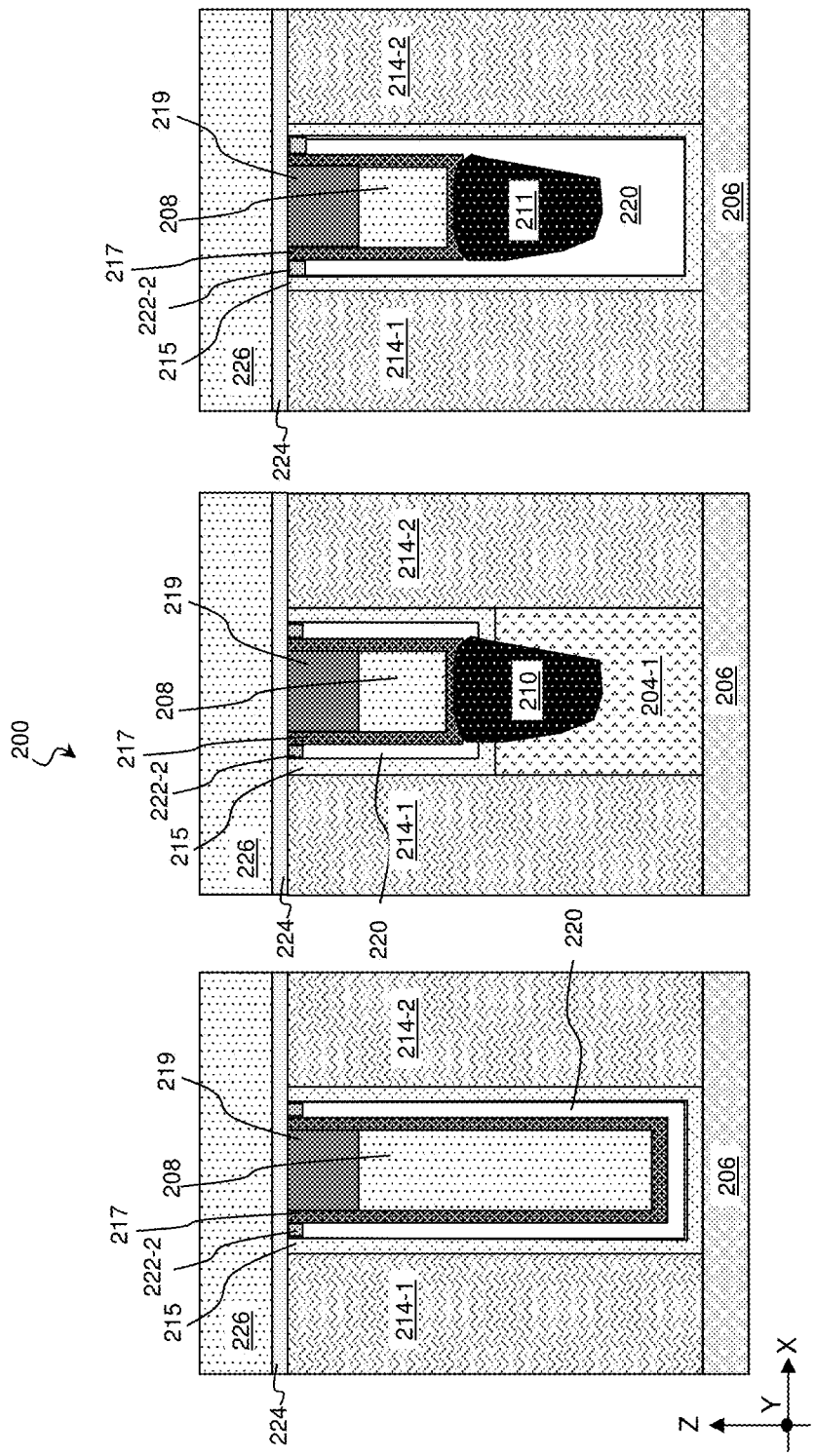

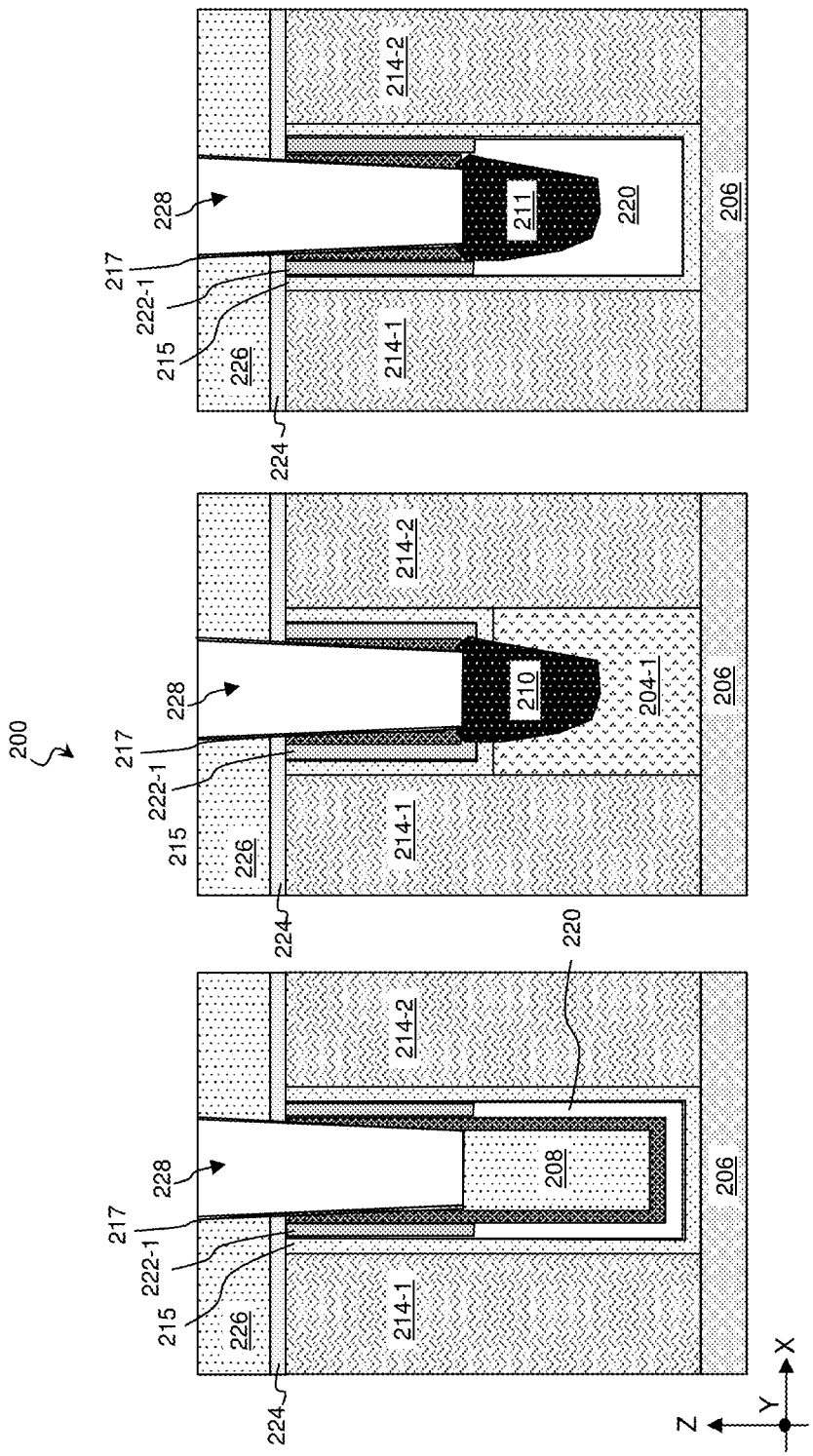

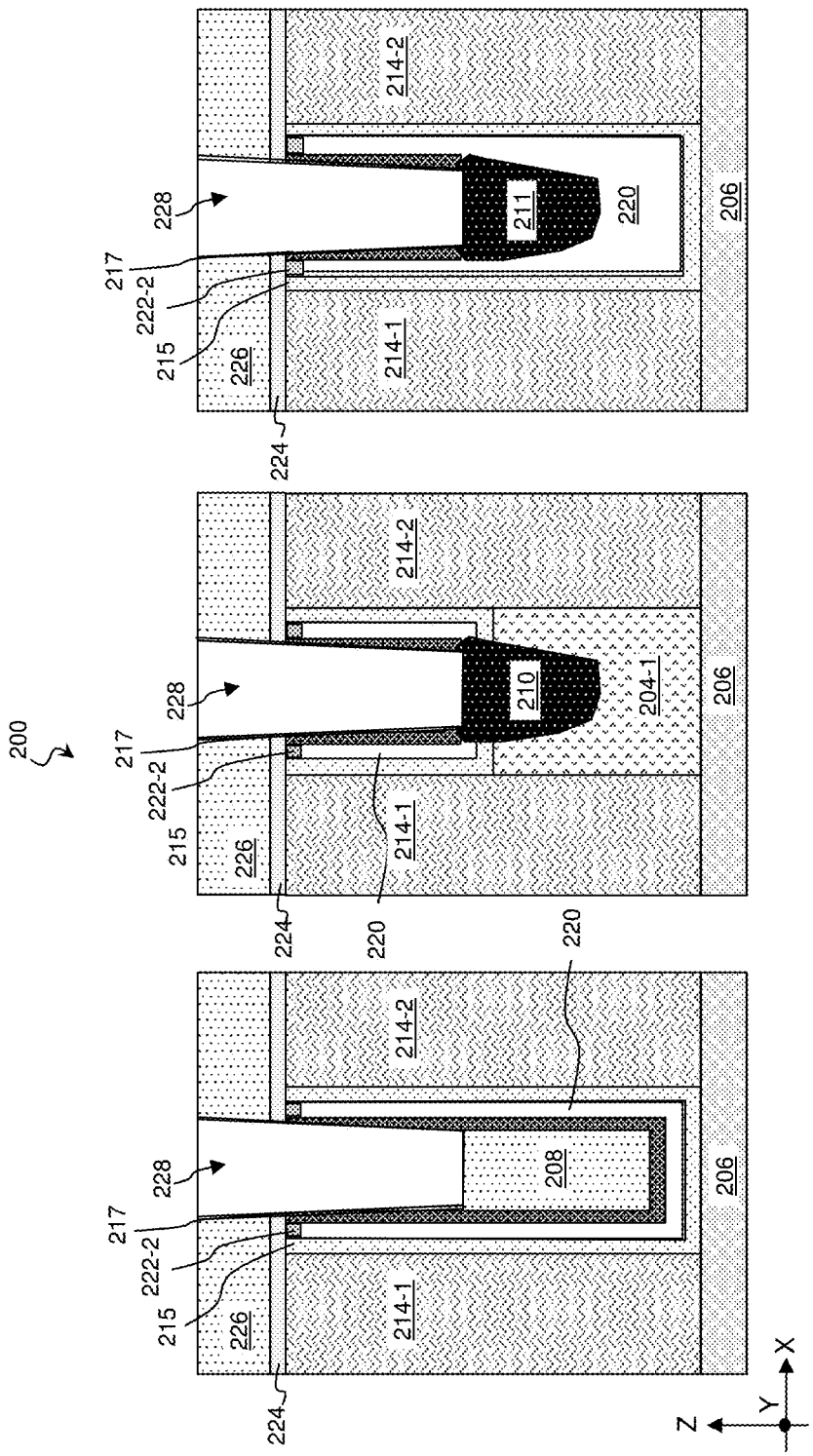

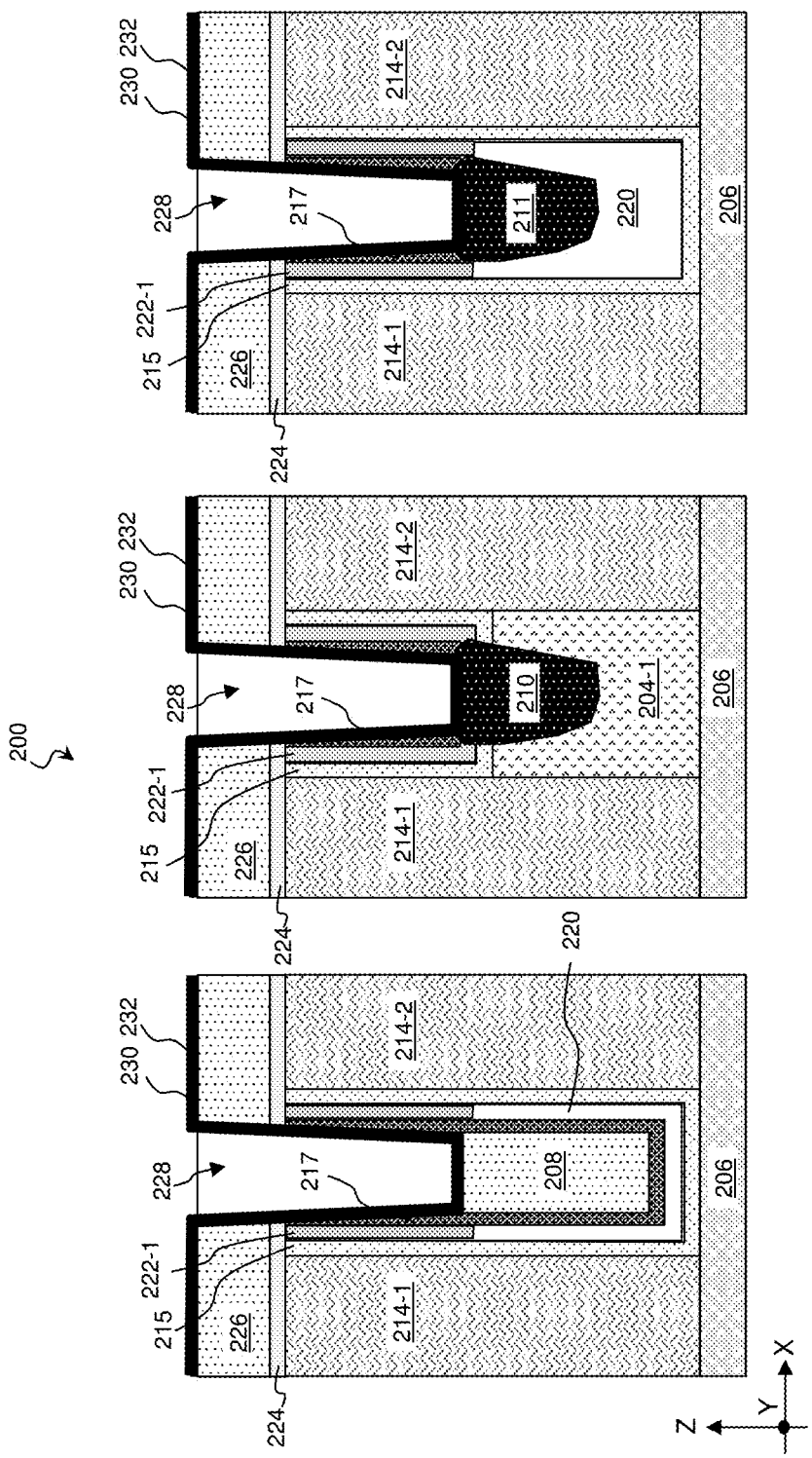

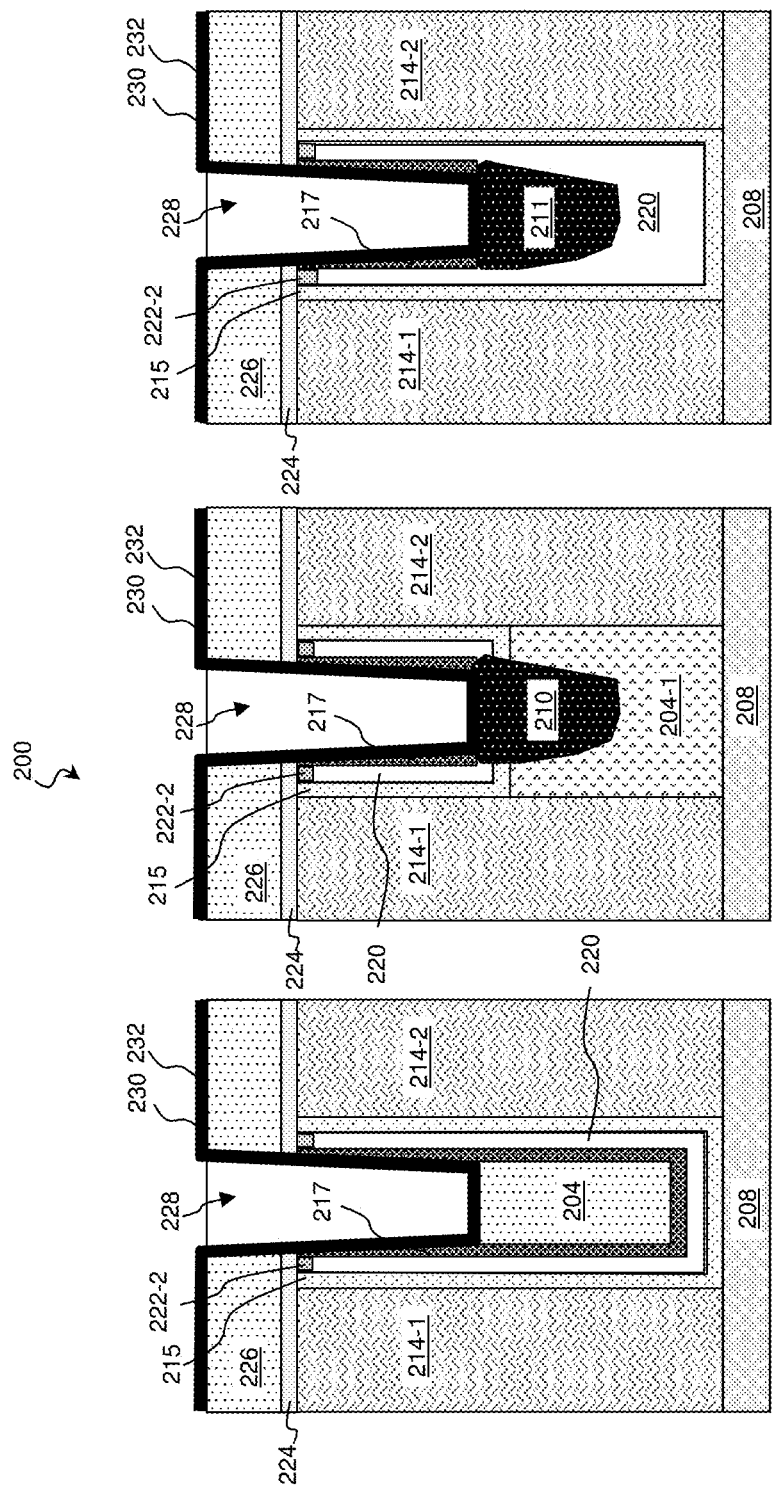

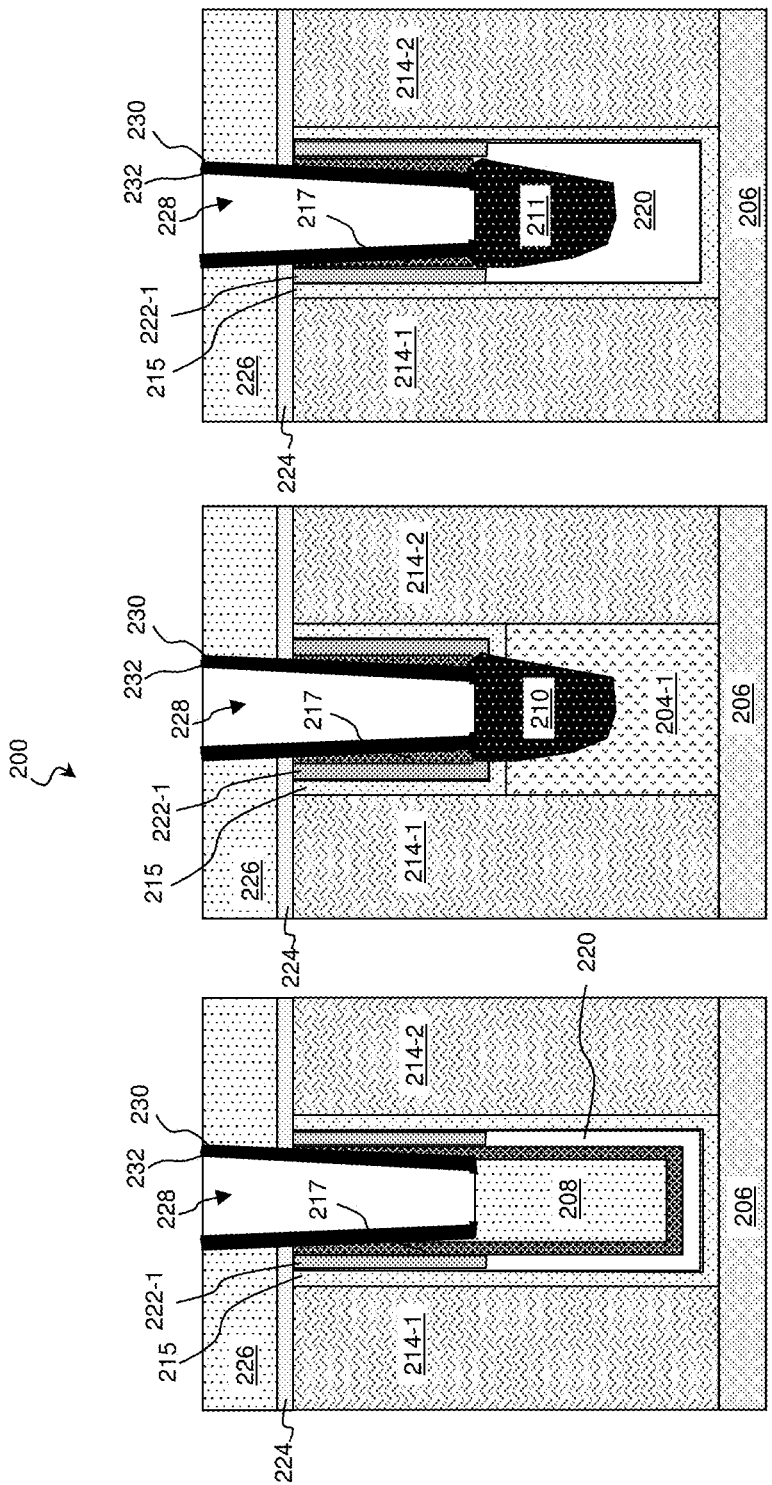

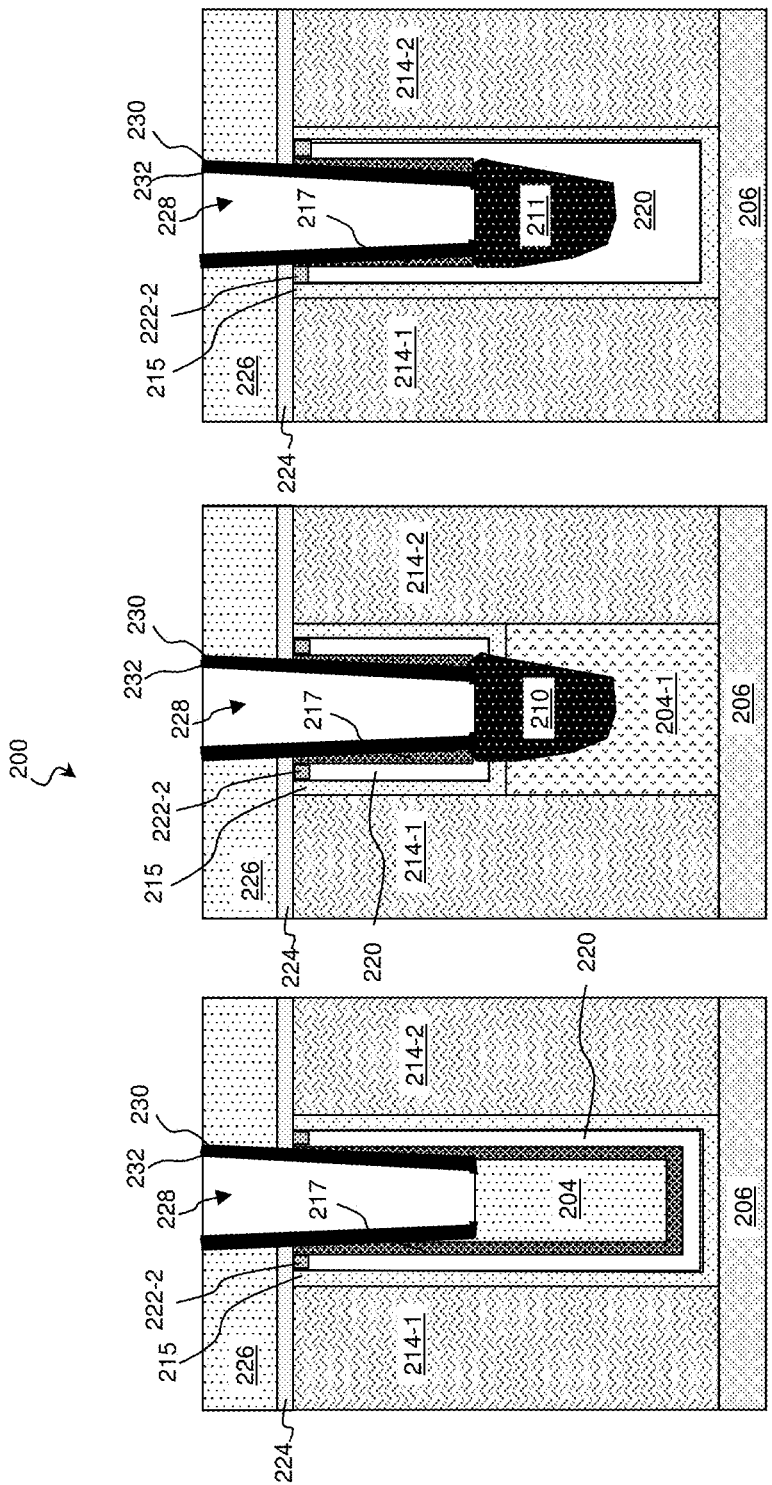

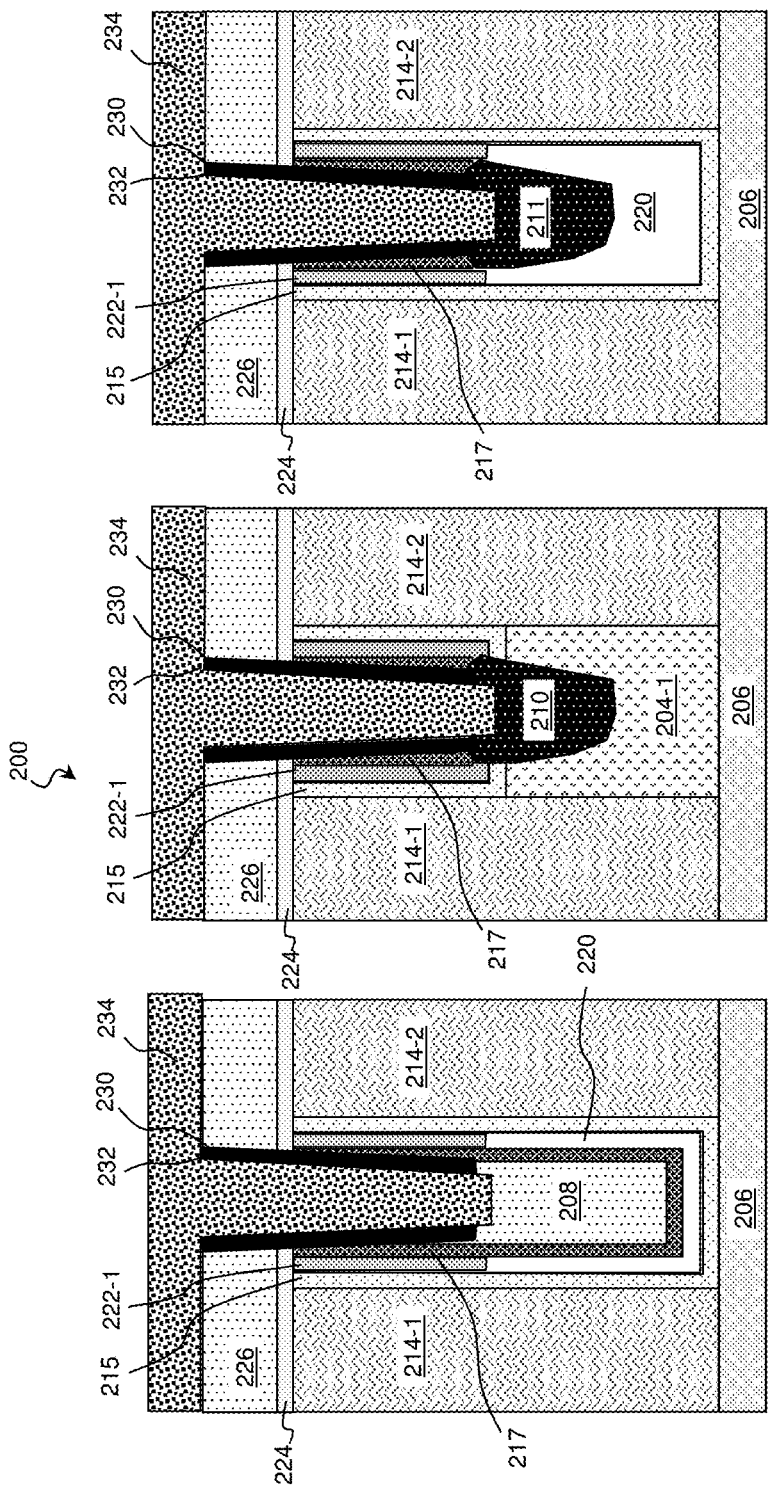

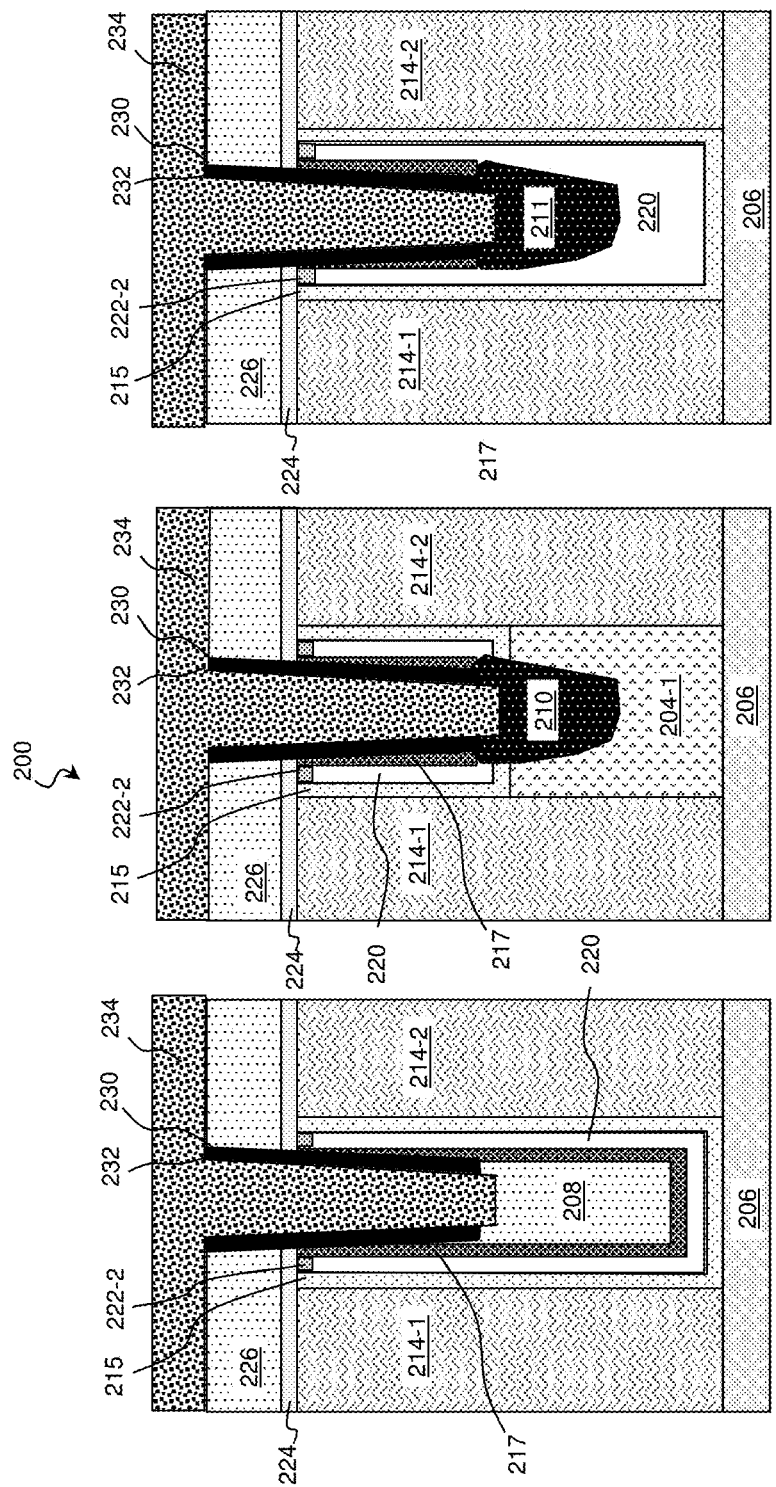

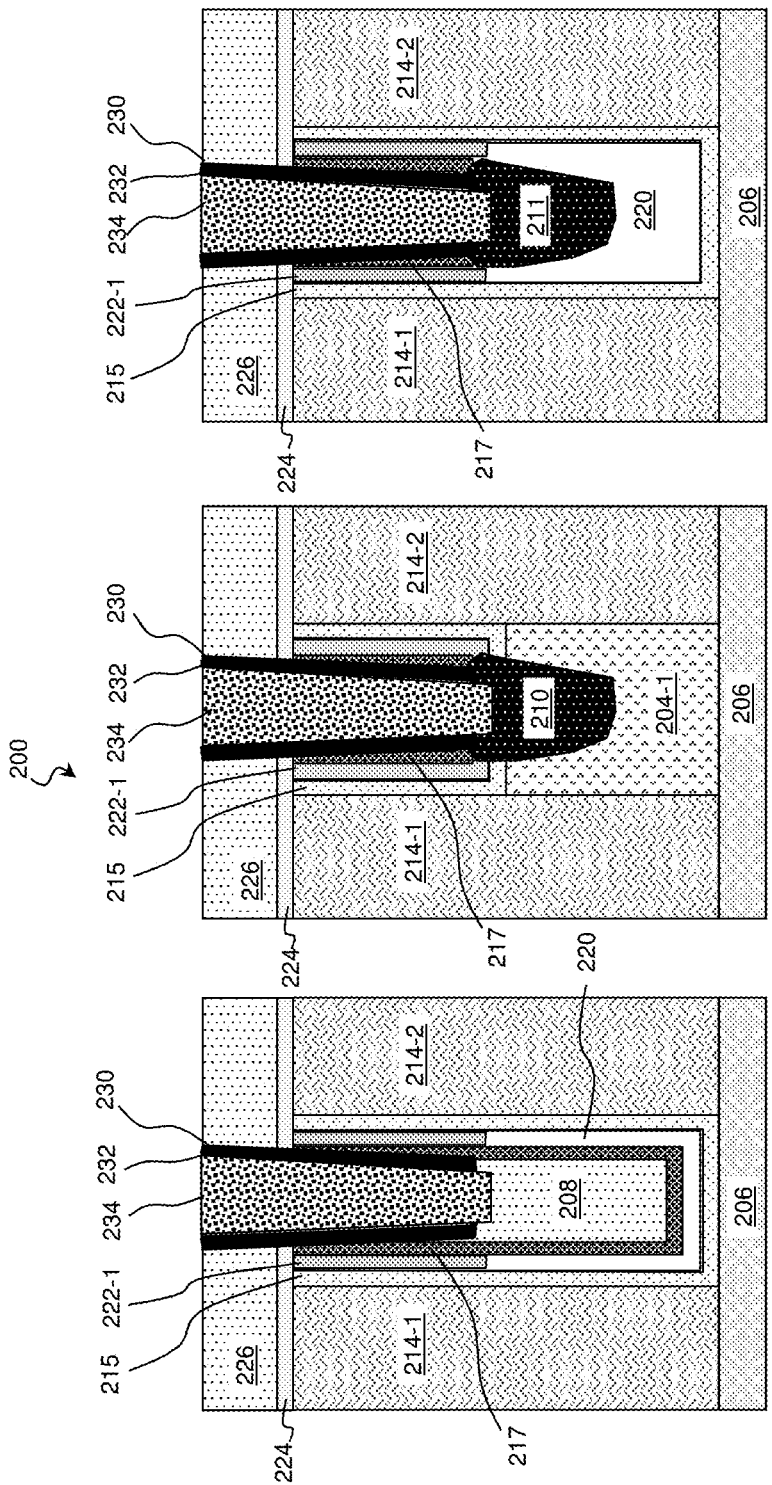

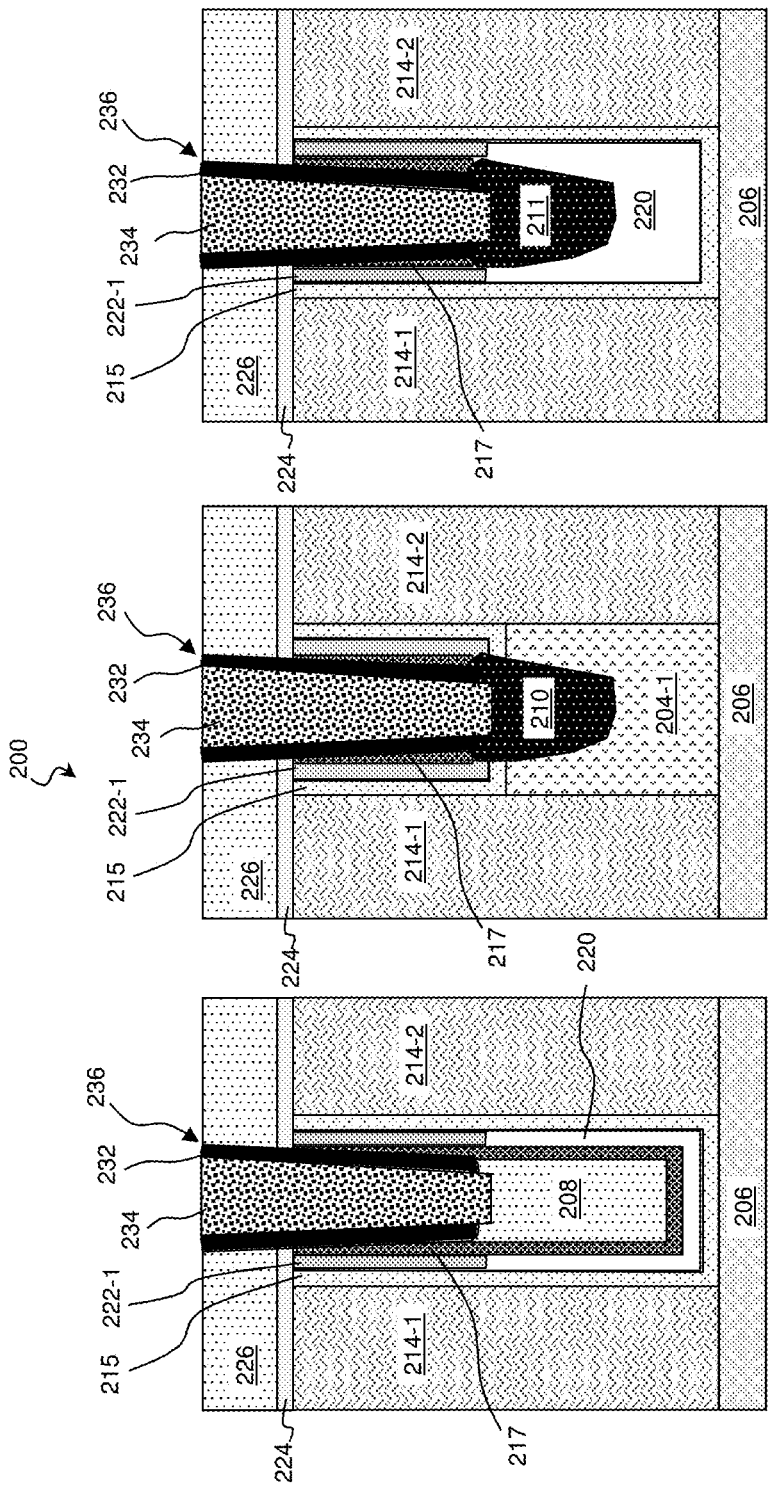

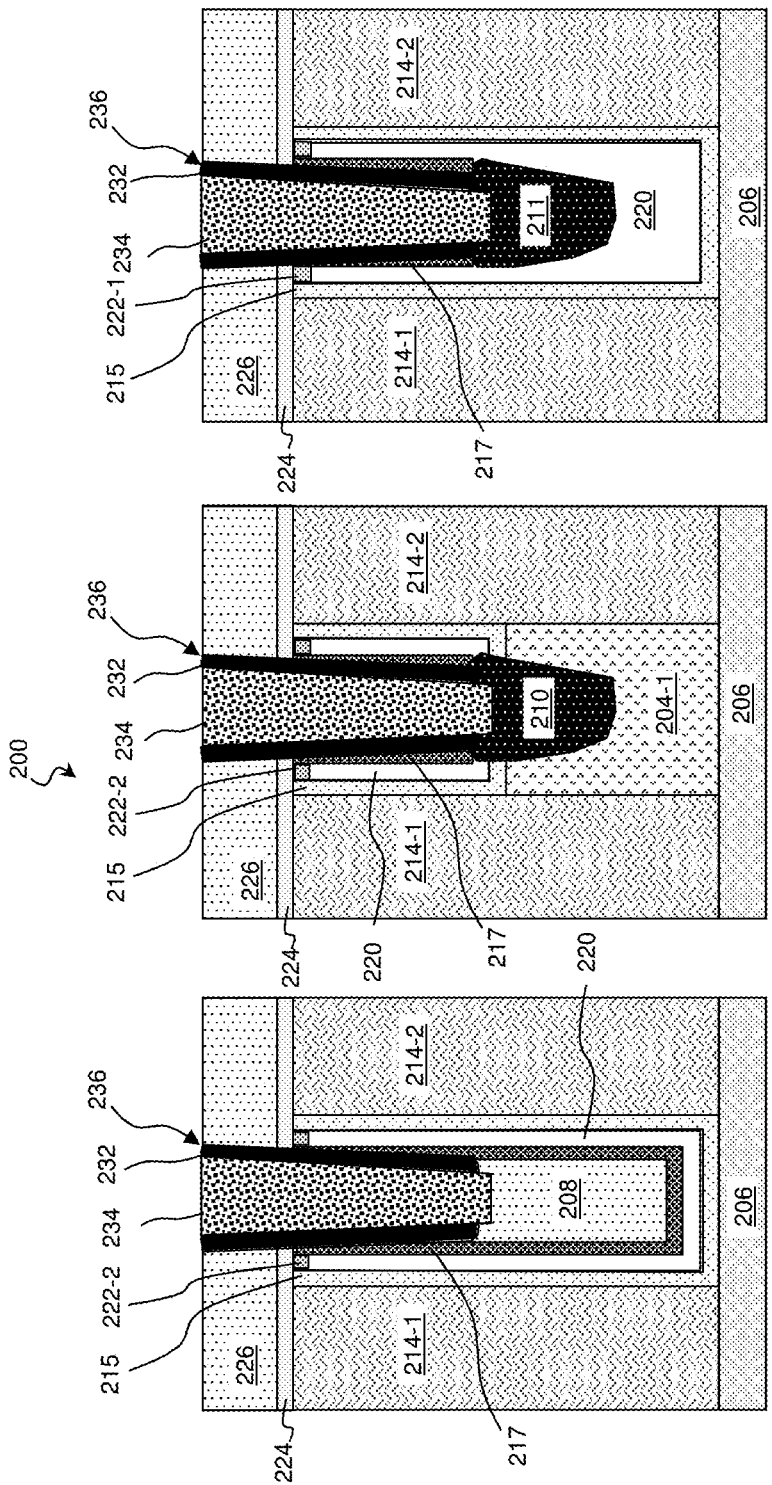

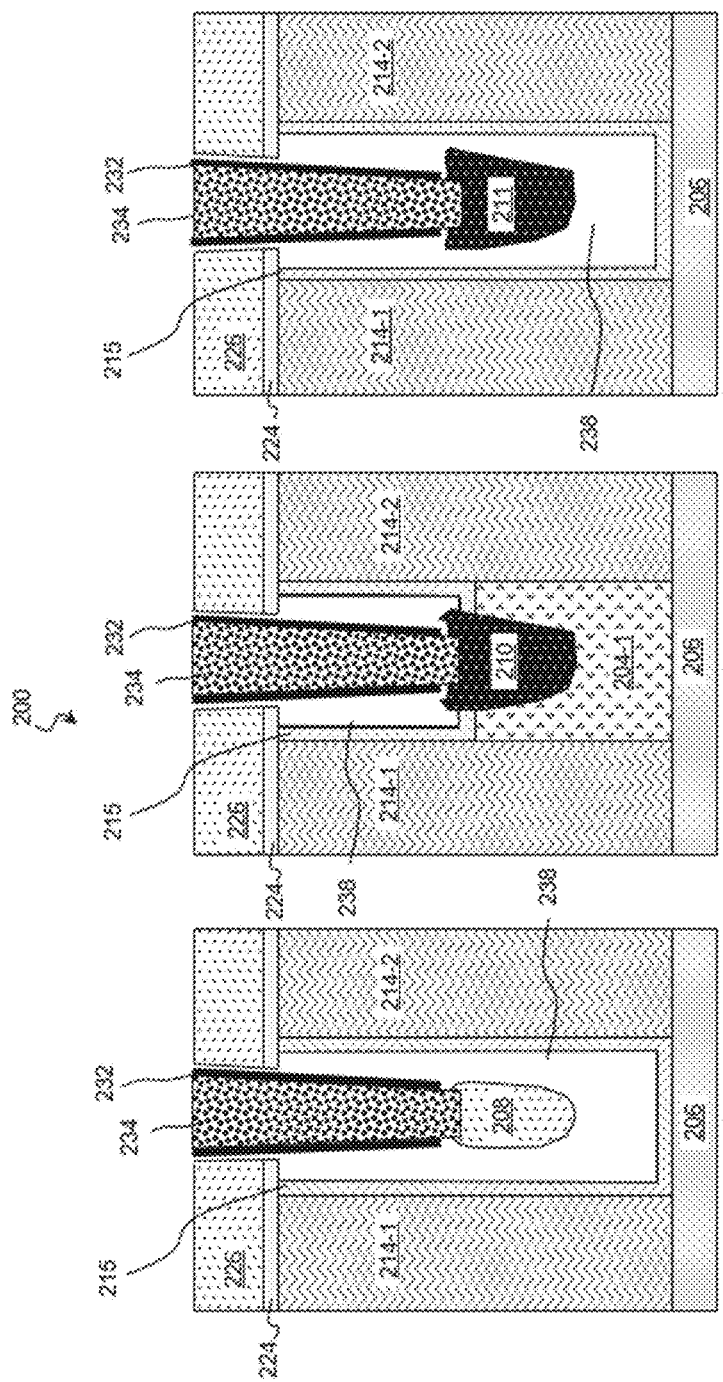

FINFET SEMICONDUCTOR DEVICE HAVING SOURCE/DRAIN CONTACT(S) SEPARATED BY AIRGAP SPACER(S) FROM THE GATE STACK(S) TO REDUCE PARASITIC CAPACITANCE

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, these advances have also increased the complexity of processing and manufacturing semiconductor devices.

For example, many methods have been developed to introduce structural features to fin-like FETs (FinFETs) for improved device performance, such as, for example, reduced parasitic capacitance between conductive features in FinFETs. While these methods have generally been adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-7A, 8A-1, 8A-2, 9A-1, 9A-2, 10A-1, 10A-2, 11A-1, 11A-2, 12A-1, 12A-2, 13A-1, 13A-2, 14A-1, 14A-2, 15A-1, 15A-2, 16A-1, 16A-2, and 16A-3 are fragmentary cross-sectional views of the workpiece in FIG. 2 along section A-A' during intermediate stages of the method shown in FIGS. 1A and 1B, according to various embodiments of the present disclosure.

FIGS. 3B-7B, 8B-1, 8B-2, 9B-1, 9B-2, 10B-1, 10B-2, 11B-1, 11B-2, 12B-1, 12B-2, 13B-1, 13B-2, 14B-1, 14B-2, 15B-1, 15B-2, 16B-1, 16B-2, and 16B-3 are fragmentary cross-sectional views of the workpiece in FIG. 2 along section B-B' during intermediate stages of the method shown in FIGS. 1A and 1B, according to various embodiments of the present disclosure.

FIGS. 3C-7C, 8C-1, 8C-2, 9C-1, 9C-2, 10C-1, 10C-2, 11C-1, 11C-2, 12C-1, 12C-2, 13C-1, 13C-2, 14C-1, 14C-2, 15C-1, 15C-2, 16C-1, 16C-2, and 16C-3 are cross-sectional views of the workpiece in FIG. 2 along section C-C' during intermediate stages of the method shown in FIGS. 1A and 1B, according to various embodiments of the present disclosure.

DETAILED DESCRIPTION

Figure 1A:
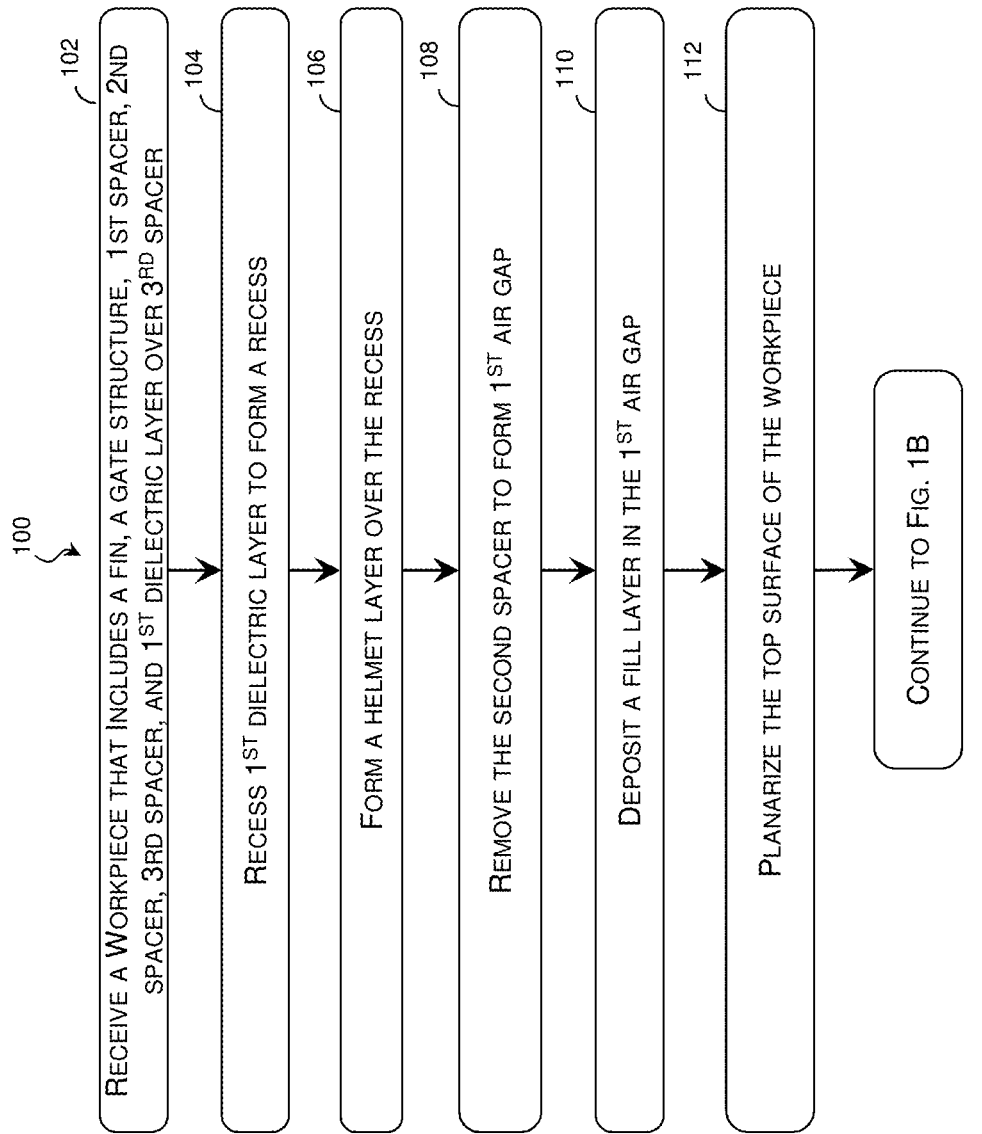
FIGS. 1A and 1B illustrate a flowchart of an example method for fabricating a semiconductor device, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to the formation of air gaps between source/drain (S/D) contacts and neighboring metal gate stacks. As FinFET technologies progress towards smaller technology nodes (such as 16 nm, 10 nm, 7 nm, 5 nm, and below), decreasing fin pitch places significant constraints on materials that can be used between metal gate stacks and neighboring S/D contacts connected to S/D features. In many instances, to lower or minimize parasitic capacitance, insulating (or dielectric) materials with relatively low dielectric constants (k), such as low-k dielectrics and/or air (by forming an air gap, for example), may be incorporated between various conductive features in a semiconductor device. In some embodiments, the present disclosure provides a semiconductor device where the source/drain contact is separated from a gate stack by two sequentially formed air gaps each sandwiched between two spacers and the two air gaps are misaligned. In some other embodiments, the two air gaps may be partially filled with a dielectric layer that has a dielectric constant lower than that of the spacers. In some alternative embodiments, the two sequentially formed air gaps may merge and become a large air gap to further reduce parasitic capacitance.

Figure 1B:
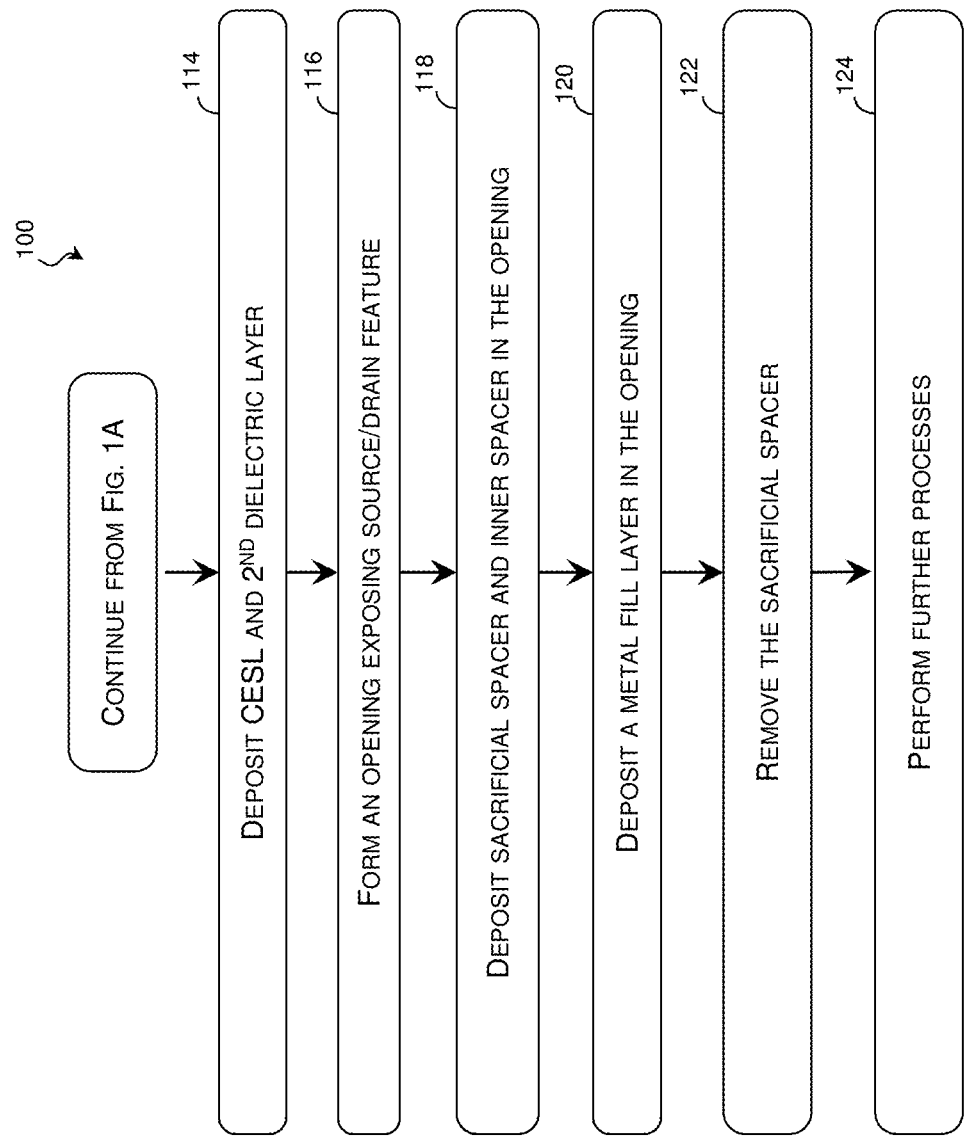

Referring now to FIGS. 1A and 1B, a flowchart of a method 100 of forming a semiconductor device on a workpiece 200 (not shown in FIGS. 1A and 1B, but shown in other figures) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2, 3A-7A, 8A-1, 8A-2, 9A-1, 9A-2, 10A-1, 10A-2, 11A-1, 11A-2, 12A-1, 12A-2, 13A-1, 13A-2, 14A-1, 14A-2, 15A-1, 15A-2, 16A-1, 16A-2, 16A-3, 3B-7B, 8B-1, 8B-2, 9B-1, 9B-2, 10B-1, 10B-2, 11B-1, 11B-2, 12B-1, 12B-2, 13B-1, 13B-2, 14B-1, 14B-2, 15B-1, 15B-2, 16B-1, 16B-2, 16B-3, 3C-7C, 8C-1, 8C-2, 9C-1, 9C-2, 10C-1, 10C-2, 11C-1, 11C-2, 12C-1, 12C-2, 13C-1, 13C-2, 14C-1, 14C-2, 15C-1, 15C-2, 16C-1, 16C-2, and 16C-3, which illustrate a portion of the workpiece 200 during various operations of method 100. The workpiece 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the workpiece 200 as illustrated includes three-dimensional FinFET devices, the present disclosure may also provide embodiments for fabricating planar FET devices. Additional features can be added in semiconductor devices fabricated on the workpiece 200, and some of the features described below can be replaced, modified, or eliminated in other embodiments of the semiconductor device to be fabricated on the workpiece 200.

Figure 2:
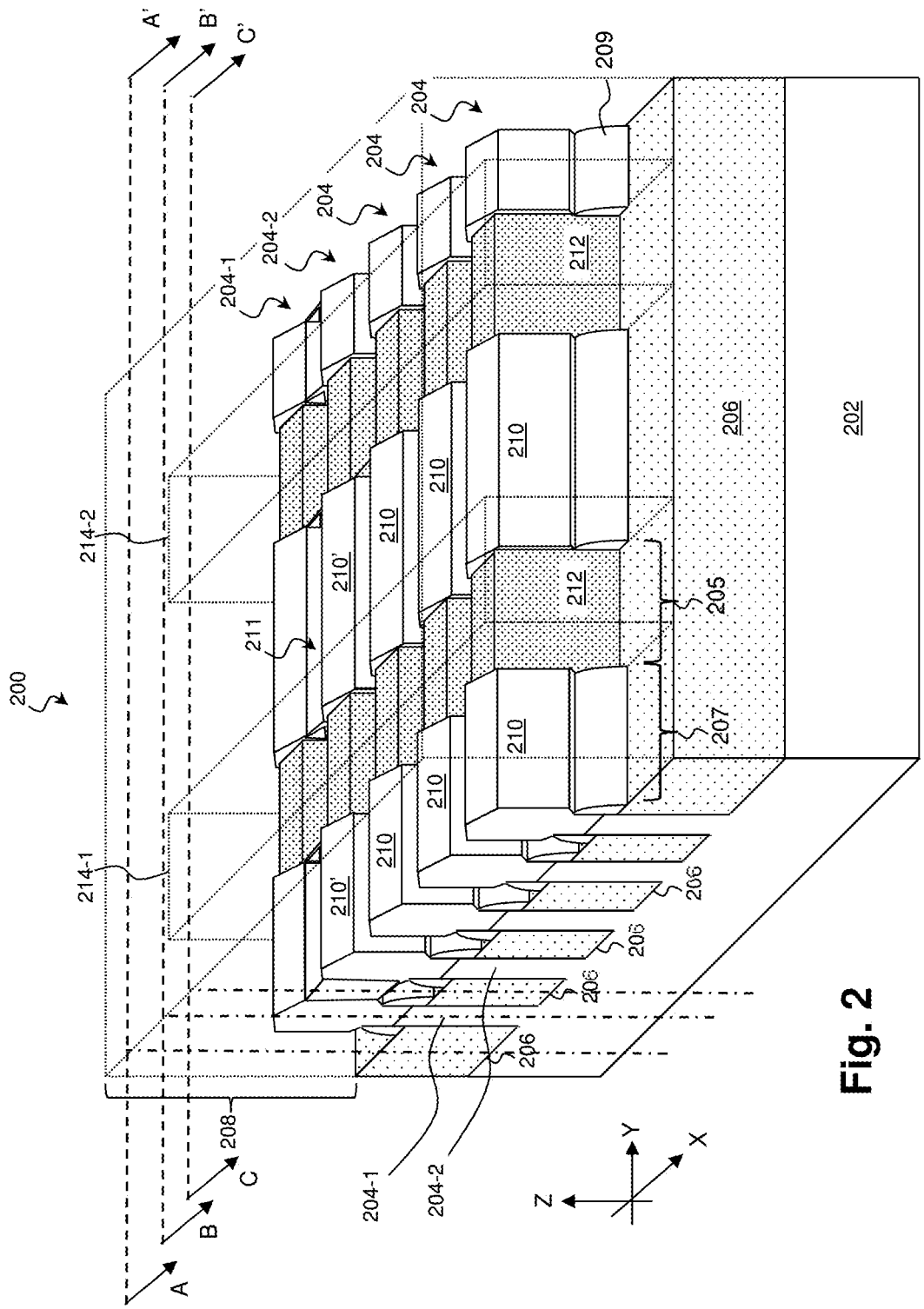
FIG. 2 is a three-dimensional perspective view of a workpiece to undergo various stages of a fabrication process, according to various embodiments of the present disclosure.

Referring to FIGS. 1A and 2, method 100 includes a block 102 where a workpiece 200 as illustrated in FIG. 2 is provided. The workpiece 200 includes a plurality of fin structures 204 (or fins 204) connected to and arising from the substrate 202. The fin structures 204 are separated from one another by an isolation feature 206. Each of the plurality of fin structures 204 may include one or more channel regions 205 and one or more source/drain regions 207. The workpiece 200 further includes one or more gate stacks 214 over the channel regions 205 of the fin structures 204. In some embodiments, each of the gate stacks 214 includes a gate dielectric layer 212 that is disposed over the channel regions 205. The workpiece 200 includes source/drain features 210 or merged source/drain features 210' that are disposed over the one or more source/drain regions 207 of a first fin structure 204-1 and a second fin structure 204-2. In some embodiments, each of the source/drain features 210 is disposed over a single fin structure 204 and is not merged with an adjacent source/drain feature 210. Each of the merged source/drain features 210' includes two source/drain features 210. The two source/drain features 210 of the merged source/drain feature 210' are disposed respectively on the first fin structure 204-1 and the second fin structure 204-2 and are merged together at a merge portion 211 therebetween. For ease of reference, the source/drain feature 210 and the merged source/drain feature 210' may be collectively referred to as source/drain features from time to time herein. Additionally, a first dielectric layer 208 is deposited over the workpiece 200, including over the source/drain features 210/210'. In some instances, the first dielectric layer 208 may be referred to as a first interlayer dielectric (ILD) layer 208.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof. In some embodiments where the substrate 202 includes FETs, various doped regions, such as source/drain regions, are disposed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The fin structures 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fin structures 204 on the substrate 202. The etching process may include dry etching, wet etching, reactive ion etching (RIE), and/or other suitable processes. Numerous other embodiments of methods for forming the fin structures 204 may be suitable. For example, the fin structures 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures 204.

The isolation feature 206 may include silicon oxide, silicon nitride, silicon oxynitride, fluoride-doped silicate glass (FSG), a low-k dielectric material, and/or other suitable materials. The isolation feature 206 may include shallow trench isolation (STI) features. In one embodiment, the isolation feature 206 may be formed by etching trenches in the substrate 202 during the formation of the fin structures 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation feature 206. Alternatively, the isolation feature 206 may include a multi-layer structure, for example, having one or more thermal oxide liner layers. The isolation feature 206 may be deposited by any suitable method, such as chemical vapor deposition (CVD), flowable CVD (FCVD), spin-on-glass (SOG), other suitable methods, or combinations thereof.

The source/drain features (including source/drain features 210 and merged source/drain features 210') may be formed by any suitable techniques, such as etching processes followed by one or more epitaxy processes. In one example, one or more etching processes are performed to remove portions of the fin structures 204 in the source/drain regions 207 to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the source/drain features may be suitable for a p-type FinFET device (e.g., including a p-type epitaxial material) or alternatively, an n-type FinFET device (e.g., including an n-type epitaxial material). The p-type epitaxial material may include one or more epitaxial layers of silicon germanium (SiGe), where the silicon germanium is doped with a p-type dopant such as boron, germanium, indium, and/or other p-type dopants. The n-type epitaxial material may include one or more epitaxial layers of silicon (Si) or silicon carbon (SiC), where the silicon or silicon carbon is doped with an n-type dopant such as arsenic, phosphorus, and/or other n-type dopant. In some implementations, each of the epitaxial growth processes may include different in-situ doping levels of suitable dopants. The epitaxial growth processes to form the source/drain features may include vapor-phase epitaxy (VPE), ultra-high vacuum CVD (UHV-CVD), a cyclic deposition and etching (CDE) process, molecular beam epitaxy (MBE), and/or other suitable processes.

The gate stacks 214 interpose the source/drain features 210/210'. A first gate stack 214-1 and a second gate stack 214-2 are shown in FIG. 2. However, the present disclosure is not so limited and may include more or less gate stacks. For ease of reference, the first and second gate stacks 214-1 and 214-2 may be referred to in a singular fashion as a gate stack 214 or collectively as gate stacks 214. The gate dielectric layer 212 includes one or more high-k (i.e., having a dielectric constant greater than that of silicon oxide, which is about 3.9) dielectric layers disposed over the channel regions 205 of the fin structures 204. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. In some instances, to enhance adhesion of the high-k dielectric layers to the channel regions 205, an interfacial layer (not shown), such as a silicon oxide layer, is first formed over the channel region 205 and the high-k dielectric layers are then formed over the interfacial layer. In embodiments represented in FIG. 2, the gate stacks 214 are functional metal gate stacks that are formed using suitable processes, such as a gate-first process, a gate-last process, or a gate replacement process.

The gate stacks 214 may include at least one work function metal layer and a bulk conductive layer disposed thereover. The work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include copper (Cu), tungsten (W), aluminum (Al), cobalt (Co), other suitable materials, or combinations thereof and may be deposited using physical vapor deposition (PVD), CVD, ALD, or other suitable processes. In some embodiments, the gate stacks 214 may include capping layers, barrier layers, other suitable layers, or combinations thereof.

In some embodiments, the first dielectric layer 208 (or the first ILD layer 208) includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the first ILD layer 208 includes an oxide-containing dielectric material. The first ILD layer 208 may include a multi-layer structure or a single-layer structure and may be formed by a deposition process such as, for example, CVD, flowable CVD (FCVD), spin-on-glass (SOG), other suitable methods, or combinations thereof.

Three cross-sectional planes, sections A-A', B-B' and C-C', are illustrated in FIG. 2. Out of them, section A-A' does not intersect any fin structures 204 and represents a cross section between two fin structures whose source/drain features do not merge. Section B-B' extends parallel to fin structures 204 and cuts through the first fin structure 204-1. Like section A-A', section C-C's also does not intersect any fin structures but, unlike section A-A', it cuts through the merge portion 211 of the merged source/drain features 210'. The merge portion 211 is disposed between the first fin structure 204-1 and the second fin structure 204-2. It is noted that while sections A-A', B-B' and C-C' each represents a similarly situated cross-section and is not limited to the specific sections A-A', B-B' and C-C' as shown in FIG. 2. For example, section A-A' may go between two source/drain features 210, between two merged source/drain features 210', adjacent a source/drain feature 210 (but not between two source/drain features 210), or adjacent a merged source/drain feature 210' (but not between two merged source/drain features 210'). FIGS. 3A-7A, 8A-1, 8A-2, 9A-1, 9A-2, 10A-1, 10A-2, 11A-1, 11A-2, 12A-1, 12A-2, 13A-1, 13A-2, 14A-1, 14A-2, 15A-1, 15A-2, 16A-1, 16A-2, and 16A-3 are fragmentary cross-sectional views of the workpiece 200 taken along section A-A' in FIG. 2 at intermediate steps of method 100. FIGS. 3B-7B, 8B-1, 8B-2, 9B-1, 9B-2, 10B-1, 10B-2, 11B-1, 11B-2, 12B-1, 12B-2, 13B-1, 13B-2, 14B-1, 14B-2, 15B-1, 15B-2, 16B-1, 16B-2, and 16B-3 are fragmentary cross-sectional views of the workpiece 200 taken along section B-B' in FIG. 2 at intermediate steps of method 100. FIGS. 3C-7C, 8C-1, 8C-2, 9C-1, 9C-2, 10C-1, 10C-2, 11C-1, 11C-2, 12C-1, 12C-2, 13C-1, 13C-2, 14C-1, 14C-2, 15C-1, 15C-2, 16C-1, 16C-2, and 16C-3 are fragmentary cross-sectional views of the workpiece 200 taken along section C-C' in FIG. 2 at intermediate steps of method 100. For illustration purposes, all fragmentary cross-sectional views of the workpiece 200 include cross-sectional views of the first gate stack 214-1, the second gate stack 214-2, and the source/drain feature 210 (or the merge portion 211) disposed between the first and second gate stacks 214-1 and 214-2.

Figure 3C:
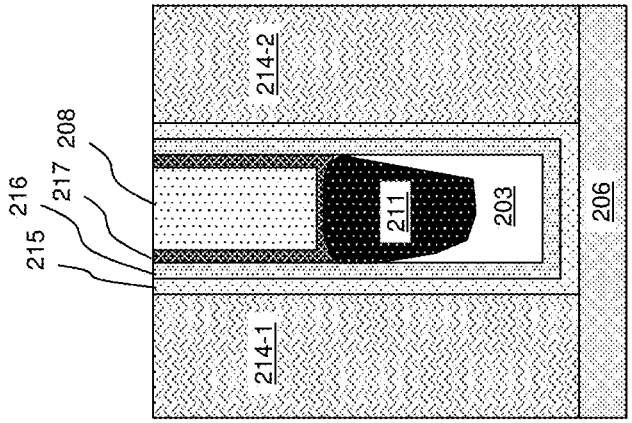
Figure 3B:
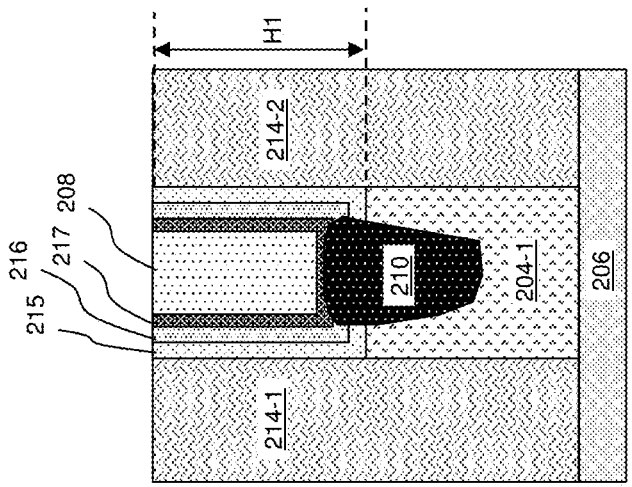
Figure 3A:
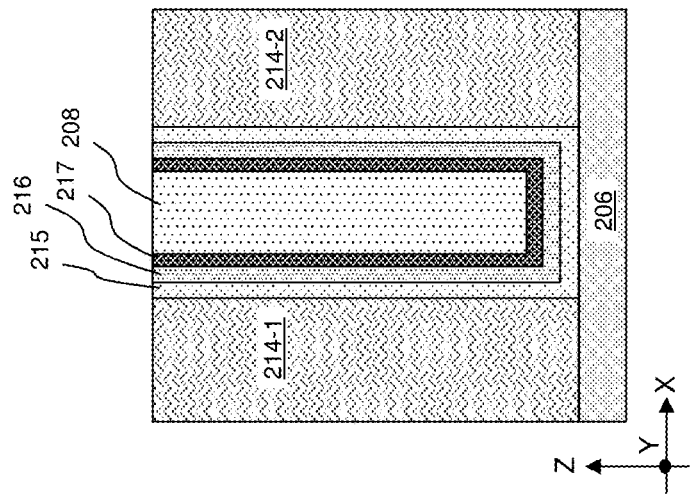
Figure 5C:
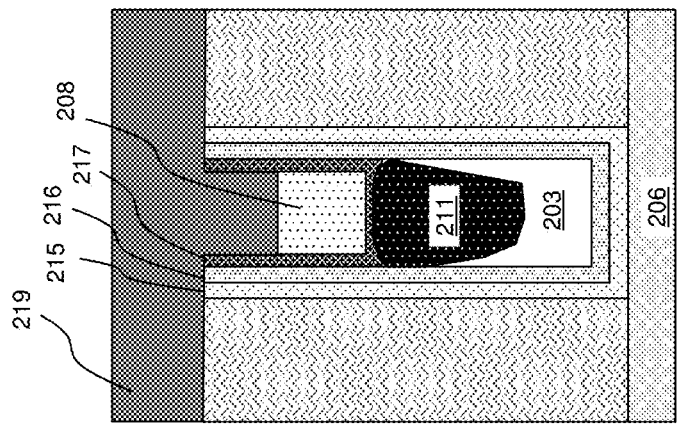
Figure 5B:
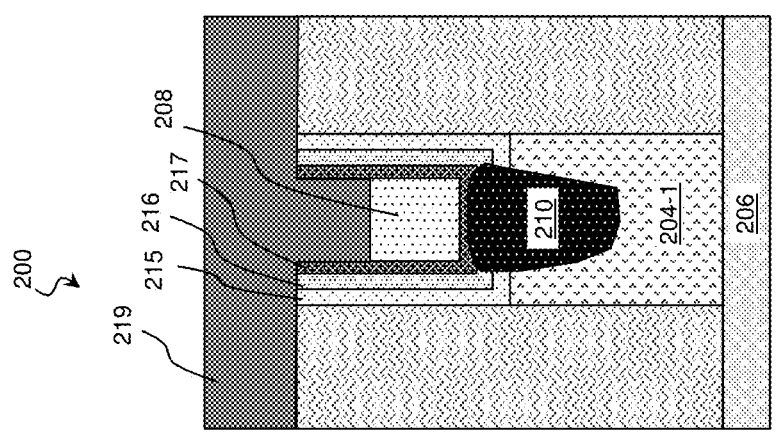
Figure 5A:
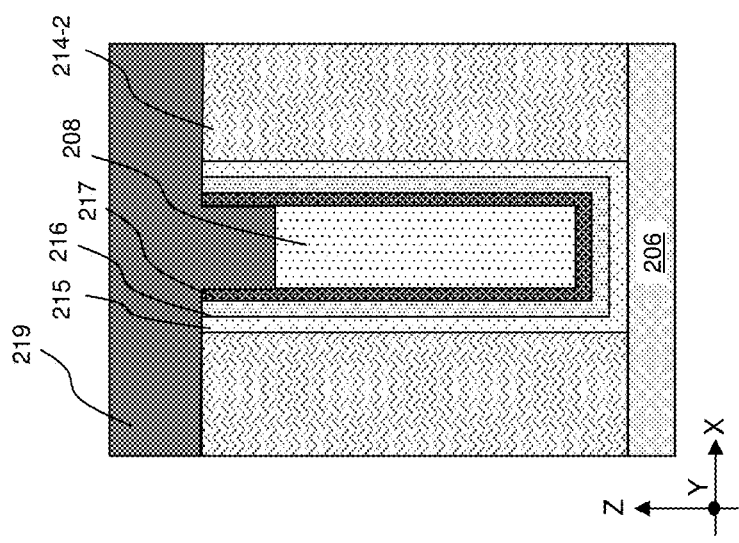
Figures 2, 15A, 15B, 15C:
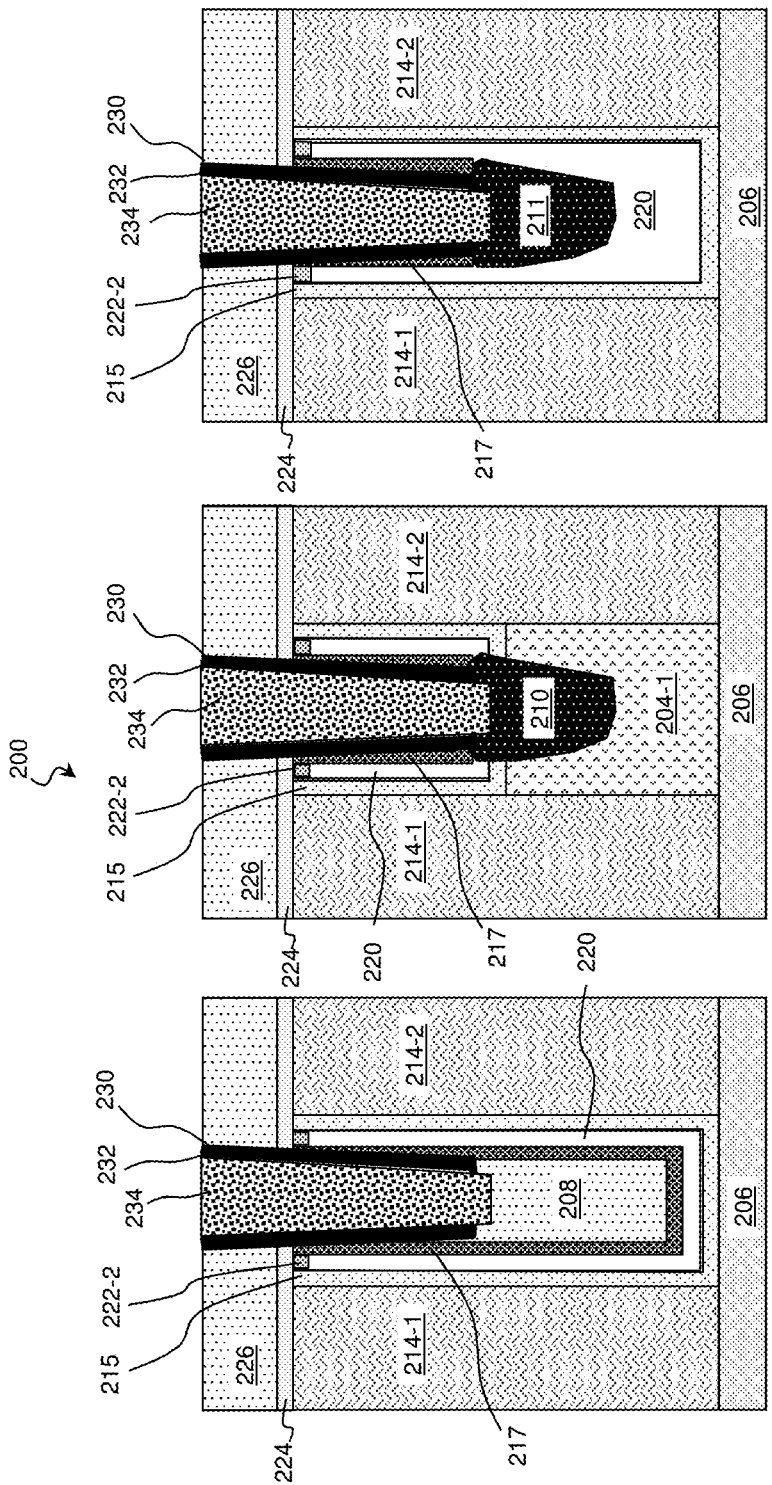

While not shown in FIG. 2 for clarity of illustration, one or more spacers (gate spacers) are sequentially disposed over sidewalls of the gate stacks 214, including the first gate stack 214-1 and the second gate stack 214-2. In some embodiments represented in FIGS. 3A, 3B and 3C, three spacers are disposed along sidewalls of the gate stacks 214. In these embodiments, a first spacer 215 is disposed over sidewalls of the gate stacks 214, a second spacer 216 is disposed over the first spacer 215, and a third spacer 217 is disposed over the second spacer 216. The first dielectric layer 208 is disposed over the third spacer 217. That is, out of the three spacers, the first spacer 215 is the closest to the gate stacks 214 and the third spacer 217 is farthest away from the gate stacks 214. FIGS. 3A, 3B and 3C illustrate the structural arrangement of the three spacers at different sections, according to some implementations of the present disclosure. Reference is first made to FIG. 3A, which illustrates a cross-section along section A-A' that does not intersect any source/drain features (210/210'). At section A-A', the first spacer 215 is in contact with sidewalls of the gate stacks 214 and the isolation feature 206. In addition, all three spacers 215, 216 and 217 are not blocked by any portion of the source/drain feature (210/210') and may extend downward toward the isolation feature 206. Reference is then made to FIG. 3A, which illustrates a cross-section along section B-B' that intersects the first fin structure 204-1. In some embodiments, the first spacer 215 and the second spacer 216 are formed over the source/drain regions 207 before the formation of the source/drain features (210/210') and are recessed to expose the source/drain regions 207. The third spacer 217 is deposited after the formation of the source/drain features (210/210'). Therefore, at section B-B', the source/drain feature (210/210') extends upward through the first spacer 215 and the second spacer 216 but is covered by the third spacer 217. In addition, at section B-B', the first spacer 215 is disposed on the source/drain region 207 of the first fin structure 204-1 and the second spacer 216 is disposed on the first spacer 215. The third spacer 217 is disposed on the second spacer 216 and the source/drain feature (210/210'). Section B-B' also illustrates a first gate height H1, which is the height of the portion of the gate stacks 214 that rises over and above the fin structures 204. In some implementations, the first gate height H1 at this stage may be between about 10 nm and about 60 nm. Reference is now made to FIG. 3C, which illustrates a cross-section along section C-C' that intersects a merge portion 211 of a merged source/drain feature 210'. In embodiments represented in FIG. 3C, the merged source/drain feature 210' is formed after formation of the first spacer 215 and the second spacer 216 but before formation of the third spacer 217. Therefore, at section C-C', the first spacer 215 and the second spacer 216 extend all the way downward toward the isolation feature 206 and a portion of the first spacer 215 and the second spacer 216 is disposed on the isolation feature 206 under the merge portion 211 of the merged source/drain feature 210'. The third spacer 217, however, does not extend under the merge portion 211 of the merged source/drain feature 210', leaving an air pocket 203 under the merged source/drain feature 210'. In some implementations, the workpiece 200 may include a fin spacer 209 which may be formed along with the one or more gate spacers. Although three spacers are illustrated, the present disclosure is not so limited and a person having ordinary skill in the art, with reference to the present disclosure, would appreciate that embodiments with more than three spacers are fully envisioned by the present disclosure.

In some embodiments, the first, second and third spacers 215, 216 and 217 may be formed of dielectric materials that include silicon, oxygen, nitrogen, and carbon. In some embodiments, compositions of the first spacer 215 and the third spacer 217 are different from the composition of the second spacer 216. In some implementations, the second spacer 216 has a smaller carbon content than the first and third spacers 215 and 217. In some implementations, the second spacer 216 has a greater oxygen content than the first and third spacers 215 and 217. In some instances, the second spacer 216 has an oxygen content greater than 40% and a carbon content smaller than 10%. The different compositions impart different etching selectivities with respect to identical etching chemistry such that the second spacer 216 may be selectively etched while the first and third spacers 215 and 217 are substantially unetched. The first spacer 215 and the third spacer 217 may have identical compositions.

Referring to FIGS. 1A, 4A, 4B, and 4C, method 100 includes a block 104 where the first dielectric layer 208 is recessed to form a recess 218. In some embodiments, at block 104, the first dielectric layer 208 is selectively etched using dry etch, wet etch, or a suitable etch technique. In some implementations, the first dielectric layer 208 is recessed such that the recess 218 has a depth D. The depth D may be one tenth (1/10) to one half (1/2) of the first gate height H1 and may be between about 5 nm and about 30 nm. In some embodiments, the recess 218 may span across sections A-A', B-B' and C-C' and can be seen all of FIGS. 4A, 4B and 4C. In some alternative embodiments, the recess 218 does not cross into section A-A' and is not visible in FIG. 4A.

Referring to FIGS. 1A, 5A, 5B, and 5C, method 100 includes a block 106 where a helmet layer 219 is formed over the recess 218. In some embodiments, the helmet layer 219 may be formed of a dielectric material that has a composition similar to that of the first spacer 215 or the third spacer 217. In that regard, the helmet layer 219 serves to protect the first dielectric layer 208 from the etching operations at block 108, to be described below. Having a composition similar to that of the first and third spacers 215 and 217, the second spacer 216 may be selectively etched while the helmet layer 219 is substantially unetched. After the helmet layer 219 is deposited over the workpiece 200, including within the recess 218, at block 106, the workpiece 200 may be planarized using CMP or a suitable method. After the planarization, as illustrated in FIGS. 6A, 6B, and 6C, top surfaces of the planarized helmet layer 219, the gate stacks 214 (the first and second gate stacks 214-1 and 214-2), the first spacer 215, the second spacer 216, and the third spacer 217 may be coplanar. Upon conclusion of the planarization, the gate height above the fin structures 204 drops from the first gate height H1 to a second gate height H2. In some implementations, the second gate height H2 is between about 10 nm and about 50 nm.

Referring to FIGS. 1A, 7A, 7B, and 7C, method 100 includes a block 108 where the second spacer 216 is removed to form a first air gap 220. In some embodiments, the workpiece 200 is subject to a dry etch, a wet etch, or a suitable etch process such that the second spacer 216 is selectively removed while the gate stacks 214 (the first and second gate stacks 214-1 and 214-2), the first spacer 215, the third spacer 217, and the helmet layer 219 are substantially unetched. Referring to FIG. 7A, in section A-A', the second spacer 216 may be completely removed in some embodiments such that the first air gap 220 substantially displaces the second spacer 216 between the first spacer 215 and the third spacer 217. Referring to FIG. 7B, at section B-B', because the source/drain feature (210/210') extends through the second spacer 216, the first air gap 220 may include two branches stemming from the source/drain feature (210/210'). In other words, a lower edge of the first air gap 220 terminates in or around the source/drain feature (210/210'). Referring to FIG. 7B, at section C-C', the first air gap 220 that displaces the second spacer 216 may merge with the air pocket 203. In that regard, the air pocket 203 may be regarded as a part of the first air gap 220 and may be labeled as such. When so regarded, the first air gap 220 extends under and around the merge portion 211 of the merged source/drain feature 210'.

Referring to FIGS. 1A, 8A-1, 8B-1, 8C-1, 8A-2, 8B-2, and 8C-2, method 100 includes a block 110 where a filler layer 221 is deposited over the first air gap 220. The filler layer 221 serves to seal off the first air gap 220 by forming plugs over the openings of the first air gap 220. Depending on the process used to deposit the filler layer 221, the filler layer 221 may extend differently into the first air gap 220. Reference is first made to FIGS. 8A-1, 8B-1 and 8C-1. In some embodiments, a process with good hole-filling capability, such as ALD, is used to deposit the filler layer 221. In those embodiments, openings of the first air gap 220 are sealed off by plugs 222-1 that extend substantially into the first air gap 220. In examples shown in FIGS. 8A-1, 8B-1 and 8C-1, the plugs 222-1 has a length that is between about 50% and about 150% of the second gate height H2. Reference is now made to FIGS. 8A-2, 8B-2 and 8C-2. In some embodiments, a process with poor hole-filling capability, such as CVD, is used to deposit the filler layer 221. In those embodiments, openings of the first air gap 220 are sealed off by plugs 222-2 that extend minimally into the first air gap 220. In examples shown in FIGS. 8A-2, 8B-2 and 8C-2, the plugs 222-2 has a length that is between about 5% and about 50% of the second gate height H2. Plugs 222-1 provide more structural strength than plugs 222-2. When structural strength is a more important consideration, plugs 222-1 are formed to provide added structural integrity. When parasitic capacitance is a more important consideration, plugs 222-2 are formed to maximize the volume of the first air gaps 220. In some implementations, the filler layer 221 may have the same composition as the first spacer 215, the third spacer 217, or the helmet layer 219. In some alternative implementations, the filler layer 221 may be formed of a dielectric material with a dielectric constant lower than that of the first spacer 215, the third spacer 217, or the helmet layer 219. In some instances, the dielectric material forming the filler layer 221 may be silicon nitride, silicon oxide, silicon oxycarbide, silicon oxycarbonitride, silicon carbonitride, or a combination thereof.

Referring to FIGS. 1A, 9A-1, 9B-1, 9C-1, 9A-2, 9B-2, and 9C-2, method 100 includes a block 112 where a top surface of the workpiece 200 is planarized. In some embodiments, the workpiece 200 is planarized using CMP or a suitable technique such that top surfaces of the gate stacks 214 (the first and second gate stacks 214-1 and 214-2), the first spacer 215, the plugs 222-1 (or 222-2, as the case may be), the third spacer 217, and the helmet layer 219 are substantially coplanar. Upon conclusion of operations at block 112, the gate height above the first fin structure 204-1 drops from the second gate height H2 to a third gate height H3. In some implementations, the third gate height H3 is between about 10 nm and about 30 nm.

Referring to FIGS. 1B, 10A-1, 10B-1, 10C-1, 10A-2, 10B-2, and 10C-2, method 100 includes a block 114 where a contact etch stop layer (CESL) 224 and a second dielectric layer 226 (or second ILD layer 226) are deposited over the workpiece 200. In some embodiments, the CESL 224 may include semiconductor nitride, such as silicon nitride. In some implementations, the second dielectric layer 226 may have a composition similar to that of the first dielectric layer 208 and the relevant descriptions are not repeated here.

Referring to FIGS. 1B, 11A-1, 11B-1, 11C-1, 11A-2, 11B-2, and 11C-2, method 100 includes a block 116 where an opening 228 is formed to expose the source/drain feature 210 or the merged source/drain feature 210'. In some embodiments, the opening 228 is etched through the second dielectric layer 226, the CESL 224, the helmet layer 219, the first dielectric layer 208, and the third spacer 217 using a photolithography process and an etch process. The photolithography process may include forming a photoresist layer (resist) overlying the workpiece 200, exposing the resist to a pattern, performing post-exposure bake processes, and developing the resist to form a masking element (not shown) including the resist. The masking element is then used for etching the opening 228 to expose the source/drain feature (210/210'). The etching process may include dry etching, wet etching, reactive ion etching (RIE), and/or other suitable processes.

Referring to FIGS. 1B, 12A-1, 12B-1, 12C-1, 12A-2, 12B-2, and 12C-2, method 100 includes a block 118 where a sacrificial spacer 230 and an inner spacer 232 are formed over the workpiece 200, including in the opening 228. In some embodiments, the sacrificial spacer 230 may be conformally deposited over top surfaces of the second dielectric layer 226 and sidewalls of the opening 228 and then the inner spacer 232 is conformally deposited over the sacrificial spacer 230. In some embodiments, the sacrificial spacer 230 may be formed of a material that can be selectively etched without substantially etching the second dielectric layer 226. In some implementations, the sacrificial spacer 230 may be formed of amorphous silicon, polysilicon, doped silicon, silicon germanium, germanium, germanium oxide, aluminum oxide, aluminum nitride, or aluminum oxynitride, or other suitable material. The inner spacer 232 may be formed of a dielectric material or a conductive material. In some instances, the inner spacer 232 may include silicon, oxygen, nitrogen, or carbon. For example, the inner spacer 232 may have a composition similar to that of the first spacer 215, the third spacer 217, or the helmet layer 219. In some other instances, the inner spacer 232 may include a metal or a metal nitride, such as tungsten, tantalum nitride, titanium nitride, cobalt nitride, nickel nitride, tungsten nitride, or a combination thereof. Reference is made to FIGS. 13A-1, 13B-1, 13C-1, 13A-2, 13B-2, and 13C-2. In some embodiments, to prevent shorting and to ensure low-resistance connection to source/drain contacts, top-facing surfaces of the sacrificial spacer 230 and the inner spacer 232 may be removed by one or more etch processes. The one or more etch processes may include a dry etch process that uses etchants such as an oxygen-containing gas, a fluorine-containing gas (e.g. $CF_4$, $SF_6$, $CH_2H_2$, $CHF_3$, and/or $C_2F_6$), a chlorine-containing gas (e.g. $Cl_2$, $CHCl_3$, $CCl_4$, and/or $BCl_3$), a bromine-containing gas (e.g. HBr and/or $CHBr_3$), an iodine-containing gas, or other suitable gases and or plasma, and/or combinations thereof. As illustrated in FIGS. 13A-1 and 13A-2, once the top-facing surfaces of the sacrificial spacer 230 and the inner spacer 232 are removed, the first dielectric layer 208 is exposed in the opening 228 in section A-A'. As illustrated in FIGS. 13B-1, 13C-1, 13B-2, and 13C-2, once the top-facing surfaces of the sacrificial spacer 230 and the inner spacer 232 are removed, the source/drain feature (210/210') is exposed in the opening 228 in sections B-B' and C-C'. In instances illustrated in FIGS. 13A-1, 13B-1, 13C-1, 13A-2, 13B-2, and 13C-2, the sacrificial spacer 230 and the inner spacer 232 over the second dielectric layer 226 are also removed at block 118.

Referring to FIGS. 1B, 14A-1, 14B-1, 14C-1, 14A-2, 14B-2, and 14C-2, method 100 includes a block 120 where a metal fill layer 234 is deposited in the opening 228. In some embodiments, the metal fill layer 234 may be formed of copper (Cu), tungsten (W), aluminum (Al), cobalt (Co), ruthenium (Ru), nickel (Ni), other suitable materials, or combinations thereof and deposited using PVD, CVD, ALD, or other suitable processes. In some embodiments, before the deposition of the metal fill layer 234, a barrier layer is first deposited over sidewalls of the inner spacer 232 and the exposed portion of the source/drain feature (210/210'). The barrier layer may include titanium, tantalum, cobalt, nickel, titanium nitride, tantalum nitride, tungsten nitride, cobalt nitride, or nickel nitride and may be deposited using CVD, PVD, ALD, or other suitable method. In some embodiments, the workpiece 200 may be annealed such that a silicide layer may be formed as a result of reactions between the source/drain feature (210/210') and the barrier layer. Referring to FIGS. 15A-1, 15B-1, 15C-1, 15A-2, 15B-2, and 15C-2, a planarization process, such as CMP, may be performed such that top surfaces of the metal fill layer 234, the inner spacer 232, the sacrificial spacer 230, and the second dielectric layer 226 are substantially planar. As illustrated in FIGS. 15A-1, 15B-1, 15C-1, 15A-2, 15B-2, and 15C-2, the planarization exposes a top surface of the sacrificial spacer 230 for removal of the sacrificial spacer 230 at block 122, to be described below.

Referring to FIGS. 1B, 16A-1, 16B-1, 16C-1, 16A-2, 16B-2, 16C-2, 16A-3, 16B-3, and 16C-3, method 100 includes a block 122 where the sacrificial spacer 230 is removed. In some embodiments represented in FIGS. 16A-1, 16B-1, 16C-1, 16A-2, 16B-2, 16C-2, a suitable etch process is used at block 122 such that the sacrificial spacer 230 is selectively removed while the inner spacer 232, the third spacer 217, the metal fill layer 234, and the second dielectric layer 226 are substantially unetched. In those embodiments, the sacrificial spacer 230 is displaced by a second air gap 236, which is sandwiched between the third spacer 217 and the inner spacer 232. Referring to FIGS. 16A-1, 16B-1, 16C-1, 16A-2, 16B-2, 16C-2, the second air gap 236 not only extends between the third spacer 217 and the inner spacer 232 but also extends between the CESL 224 and the second dielectric layer 226, on the one hand, and the inner spacer 232, on the other. In that regard, a portion of the metal fill layer 234, a portion of the CESL 224 and a portion of the second dielectric layer 226 are exposed in the second air gap 236. In addition, in those embodiments shown in FIGS. 16A-1, 16B-1, 16C-1, 16A-2, 16B-2, 16C-2, the second air gap 236 are not in fluid communication with the first air gap 220. That is, in the embodiments in FIGS. 16A-1, 16B-1, 16C-1, 16A-2, 16B-2, 16C-2, the metal fill layer 234 may be separated from the gate stacks 214 (the first and second gate stacks 214-1 and 214-2) by the first spacer 215, the first air gap 220, the third spacer 217, the second air gap 236, the inner spacer 232, and the barrier layer (if formed). The metal fill layer 234, along with the barrier layer (if formed), may be referred to as the source/drain contact. In embodiments illustrated in FIGS. 16A-1 and 16A-2, the first air gap 220 tracks along the third spacer 217 and has a U-shape when viewed along the Y direction; and the second air gap 236 tracks along the inner spacer 232 and terminates at the metal fill layer 234. In embodiments illustrated in FIG. 16B-1, the first air gap 220 is substantially filled by the plug 222-1; and the second air gap 236 tracks along the inner spacer 232 and terminates at the metal fill layer 234. In embodiments illustrated in FIG. 16B-2, the first air gap 220 tracks along the third spacer 217 and terminates at the source/drain feature 210; and the second air gap 236 tracks along the inner spacer 232 and terminates at the metal fill layer 234. In embodiments illustrated in FIGS. 16C-1 and 16C-2, the first air gap 220 extends along and around the merge portion 211 and has a U-shape when viewed along the Y direction; and the second air gap 236 tracks along the inner spacer 232 and terminates at the metal fill layer 234.

In some alternative embodiments represented in FIGS. 16A-3, 16B-3, and 16C-3, a suitable etch process is used at block 122 such that the sacrificial spacer 230 and third spacer 217 are etched while the inner spacer 232, the metal fill layer 234, and the second dielectric layer 226 are substantially unetched. In those alternative embodiments, a third air gap 238 is formed. The third air gap 238 engulfs in full the first air gap 220 and the second air gap 236 and is larger than the first air gap 220 and the second air gap 236. In the embodiments shown in FIGS. 16A-3, 16B-3 and 16C-3, the third spacer 217 is substantially removed. In other embodiments, the third spacer 217 is etched through such that the first air gap 220 and the second air gap 236 are merged but some third spacer 217 remain. In some implementations, the plugs 222-1 and 222-2 may also be removed at block 122. Referring to FIG. 16A-3, at section A-A', the first dielectric layer 208 between two source/drain features (210/210') may not be completely removed and the third air gap 238 extends under the first dielectric layer 208. In some other instances not shown, the first dielectric layer 208 in section A-A' may be completely removed. Referring to FIG. 16B-3, at section B-B', the third air gap 238 substantially extends between the inner spacer 232 and the first spacer 215. Because the first spacer 215 is substantially unetched, the first fin structure 204-1 is not exposed in the third air gap 238. Referring now to FIG. 16C-3, in section C-C', the third air gap 238 extends under and around the merge portion 211 of the merged source/drain feature 210'. In embodiments illustrated in FIG. 16A-3, the third air gap 238 tracks along the first spacer and around the first dielectric layer 208 and has a U-shape when viewed along the Y direction. In embodiments illustrated in FIG. 16B-3, the first spacer 215, the source/drain feature 210, the metal fill layer 234, and the inner spacer layer 232 are exposed in the third air gap 238. In embodiments illustrated in FIG. 16C-3, the third air gap 238 tracks along the first spacer and around the merge portion 211 and has a U-shape when viewed along the Y direction.

Referring to FIG. 1B, method 100 includes a block 124 where further processes are performed. For example, such further processes may include formation of another filler layer to seal off the second air gap 236 shown in FIGS. 16A-1, 16B-1, 16C-1, 16A-2, 16B-2, 16C-2 or the third air gap 238 shown in FIGS. 16A-3, 16B-3 and 16C-3. For another example, such further processes may include formation of further interconnect structures, which may include deposition of another CESL, deposition of another ILD layer, formation of a via opening/trench, deposition of another barrier layer, and formation of a via plug/metal line.

Although not intended to be limiting, one or more embodiments of the present disclosure provide benefits. For example, the present disclosure provides embodiments of semiconductor devices where gate stacks and source/drain contacts are separated by two misaligned air gaps or a large merged air gap, thereby reducing parasitic capacitance between these components during device operation. In some embodiments where the semiconductor device includes a merged source/drain region, one of the misaligned air gaps extends under a merge portion of the merged source/drain region and the other of the misaligned air gaps extends upward from the merged source/drain feature. Embodiments of the disclosed methods can be readily integrated into existing manufacturing processes and technologies, such as middle end of line (MEOL) and back end of line (BEOL) processes.

Thus, in one embodiment, a semiconductor device is provided. The semiconductor device includes a first gate stack, a second gate stack, a first source/drain feature disposed between the first and second gate stacks, and a source/drain contact over and electrically coupled to the first source/drain feature. The source/drain contact is spaced apart from each of the first and second gate stacks by an inner spacer disposed on sidewalls of the source/drain contact, a first air gap disposed along the inner spacer, a first gate spacer, and a second air gap separated from the first air gap by the first gate spacer.

In some embodiments, the semiconductor device further includes an etch stop layer over the first and second gate stacks and an interlayer dielectric layer over the etch stop layer. The etch stop layer and the interlayer dielectric layer are exposed in the first air gap. In some implementations, the first air gap extends along the inner spacer and a lower edge of the first air gap terminates in the first source/drain feature. In some instances, the inner spacer is conductive. In some implementations, the semiconductor device further includes a second gate spacer disposed on sidewalls of the first and second gate stacks. The second air gap is sandwiched between the first and second gate spacers. In some instances, the semiconductor device may further include a second source/drain feature merged with the first source/drain feature at a merge portion. The first source/drain feature is disposed over a source/drain region of a first fin and the second source/drain feature is disposed over a source/drain region of a second fin adjacent the first fin. In some embodiments, the second air gap extends under the merge portion.

In another embodiment, a semiconductor device is provided. The semiconductor device includes a first fin, a second fin, a first source/drain feature over a source/drain region of the first fin, a second source/drain feature over a source/drain region of the second fin, a first gate stack over the first and second fins, a second gate stack over the first and second fins, and a source/drain contact over and electrically coupled to the first and second source/drain features. The second source/drain feature is merged with the first source/drain feature at a merge portion. The source/drain contact is separated from each of the first and second gate stacks by a first air gap. The first air gap extends under the merge portion.

In some embodiments, the first air gap is sandwiched between a first gate spacer on a sidewall of the first gate stack and a second gate spacer in contact with the first source/drain feature. In some implementations, dielectric constants of the first gate spacer and the second gate spacer are greater than 4. In some instances, the semiconductor device may further include an inner spacer on sidewalls of the source/drain contact, and a second air gap sandwiched between the inner spacer and the second gate spacer. In some embodiments, the inner spacer includes silicon, nitrogen, carbon, or oxygen. In some implementations, the inner spacer includes tantalum nitride, titanium nitride, nickel nitride, cobalt nitride, or tungsten nitride.

In yet another embodiment, a method is provided. The method includes providing a workpiece. The workpiece includes a first fin including a first channel region and a first source/drain region adjacent the first channel region, a gate stack over the first channel region, a first source/drain feature over the first source/drain region, a first spacer over sidewalls of the gate stack, a second spacer over sidewalls of the first spacer, a third spacer over sidewalls of the second spacer, and a first dielectric layer over the third spacer. The method further includes selectively removing the second spacer to form a first air gap between the first spacer and the third spacer, forming an opening through the first dielectric layer to expose the first source/drain feature, depositing a sacrificial spacer in the opening, depositing an inner spacer over the sacrificial spacer, depositing a metal fill layer over the inner spacer, and removing the sacrificial spacer to form a second air gap.

In some embodiments, the selectively removing of the second spacer includes recessing the first dielectric layer, depositing a helmet dielectric layer over the recessed first dielectric layer, planarizing the workpiece to remove the helmet dielectric layer over the gate stack, and etching the second spacer while the first spacer, the second spacer, and the helmet dielectric layer are substantially unetched. In some implementations, the method may further include depositing an etch stop layer over the workpiece and depositing a second dielectric layer over the etch stop layer. The opening extends through the second dielectric layer and the etch stop layer. In some instances, the sacrificial spacer includes polysilicon. In some embodiments, the inner spacer includes a dielectric material including silicon, oxygen, nitrogen, or carbon. In some implementations, the inner spacer may include tantalum nitride, titanium nitride, nickel nitride, cobalt nitride, or tungsten nitride. In some instances, an oxygen content of the second spacer is greater than an oxygen content of the first spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gate stack;
   a second gate stack;
   a first source/drain feature disposed between the first and second gate stacks; and
   a source/drain contact over and electrically coupled to the first source/drain feature,
   wherein the source/drain contact is spaced apart from each of the first and second gate stacks by:
      an inner spacer disposed on sidewalls of the source/drain contact,
      a first air gap disposed along the inner spacer,
      a first gate spacer, and
      a second air gap separated from the first air gap by the first gate spacer.

2. The semiconductor device of claim 1, further comprising:
   a second source/drain feature merged with the first source/drain feature at a merge portion, wherein the first source/drain feature is disposed over a source/drain region of a first fin and the second source/drain feature is disposed over a source/drain region of a second fin adjacent the first fin.

3. The semiconductor device of claim 2, wherein the second air gap extends under the merge portion.

4. The semiconductor device of claim 1, further comprising:
an etch stop layer over the first and second gate stacks; and
an interlayer dielectric layer over the etch stop layer,
wherein the etch stop layer and the interlayer dielectric layer are exposed in the first air gap.

5. The semiconductor device of claim 1, wherein the first air gap extends along the inner spacer and a lower edge of the first air gap terminates in the first source/drain feature.

6. The semiconductor device of claim 1, wherein the inner spacer is conductive.

7. The semiconductor device of claim 1, further comprising:
a second gate spacer disposed on sidewalls of the first and second gate stacks,
wherein the second air gap is sandwiched between the first and second gate spacers.

8. A semiconductor device, comprising:
a first fin;
a second fin;
a first source/drain feature over a source/drain region of the first fin;
a second source/drain feature over a source/drain region of the second fin, the second source/drain feature merged with the first source/drain feature at a merge portion;
a first gate stack over the first and second fins;
a second gate stack over the first and second fins; and
a source/drain contact over and electrically coupled to the first and second source/drain features,
wherein the source/drain contact is separated from each of the first and second gate stacks by a first air gap,
wherein the first air gap extends under the merge portion.

9. The semiconductor device of claim 8,
wherein the first air gap is sandwiched between a first gate spacer on a sidewall of the first gate stack and a second gate spacer in contact with the first source/drain feature.

10. The semiconductor device of claim 9, further comprising:
an inner spacer on sidewalls of the source/drain contact; and
a second air gap sandwiched between the inner spacer and the second gate spacer.

11. The semiconductor device of claim 10, wherein the inner spacer comprises silicon, nitrogen, carbon, or oxygen.

12. The semiconductor device of claim 10, wherein the inner spacer comprises tantalum nitride, titanium nitride, nickel nitride, cobalt nitride, or tungsten nitride.

13. The semiconductor device of claim 9,
wherein dielectric constants of the first gate spacer and the second gate spacer are greater than 4.

14. A method, comprising:
providing a workpiece, the workpiece including:
a first fin including a first channel region and a first source/drain region adjacent the first channel region,
a gate stack over the first channel region,
a first source/drain feature over the first source/drain region,
a first spacer over sidewalls of the gate stack,
a second spacer over sidewalls of the first spacer,
a third spacer over sidewalls of the second spacer, and
a first dielectric layer over the third spacer;
selectively removing the second spacer to form a first air gap between the first spacer and the third spacer;
forming an opening through the first dielectric layer to expose the first source/drain feature;
depositing a sacrificial spacer in the opening;
depositing an inner spacer over the sacrificial spacer;
depositing a metal fill layer over the inner spacer; and
removing the sacrificial spacer to form a second air gap.

15. The method of claim 14, wherein the selectively removing of the second spacer comprises:
recessing the first dielectric layer;
depositing a helmet dielectric layer over the recessed first dielectric layer;
planarizing the workpiece to remove the helmet dielectric layer over the gate stack; and
etching the second spacer while the first spacer, the second spacer, and the helmet dielectric layer are substantially unetched.

16. The method of claim 14, further comprising:
depositing an etch stop layer over the workpiece; and
depositing a second dielectric layer over the etch stop layer,
wherein the opening extends through the second dielectric layer and the etch stop layer.

17. The method of claim 14, wherein the sacrificial spacer comprises polysilicon.

18. The method of claim 14, wherein the inner spacer comprises a dielectric material comprising silicon, oxygen, nitrogen, or carbon.

19. The method of claim 14, wherein the inner spacer comprises tantalum nitride, titanium nitride, nickel nitride, cobalt nitride, or tungsten nitride.

20. The method of claim 14, wherein an oxygen content of the second spacer is greater than an oxygen content of the first spacer.

* * * * *